United States Patent
Ummethala et al.

(10) Patent No.: US 9,690,213 B2
(45) Date of Patent: Jun. 27, 2017

(54) LINEAR STAGE FOR REFLECTIVE ELECTRON BEAM LITHOGRAPHY

(75) Inventors: Upendra Ummethala, Cupertino, CA (US); Layton Hale, Castro Valley, CA (US); Joshua Clyne, Sunnyvale, CA (US); Samir Nayfeh, Shrewsbury, MA (US); Mark Williams, Beaufort, SC (US); Joseph A. Di Regolo, Livermore, CA (US); Andrew Wilson, Forest Hills, NY (US)

(73) Assignee: KLA-Tencor Corporation, Milpitas, CA (US)

( * ) Notice: Subject to any disclaimer, the term of this patent is extended or adjusted under 35 U.S.C. 154(b) by 498 days.

(21) Appl. No.: 13/824,079

(22) PCT Filed: Sep. 6, 2012

(86) PCT No.: PCT/US2012/053927
§ 371 (c)(1),
(2), (4) Date: Jul. 29, 2013

(87) PCT Pub. No.: WO2013/036615
PCT Pub. Date: Mar. 14, 2013

(65) Prior Publication Data
US 2013/0293865 A1 Nov. 7, 2013

Related U.S. Application Data

(60) Provisional application No. 61/531,509, filed on Sep. 6, 2011.

(51) Int. Cl.
*G03F 7/20* (2006.01)
*H01J 37/20* (2006.01)
(Continued)

(52) U.S. Cl.
CPC .......... *G03F 7/70716* (2013.01); *B82Y 10/00* (2013.01); *B82Y 40/00* (2013.01);
(Continued)

(58) Field of Classification Search
CPC ............. G03F 7/70716; G03F 7/70758; G03F 7/70725; G03F 7/70766; H01J 37/20;
(Continued)

(56) References Cited

U.S. PATENT DOCUMENTS 4,210,806 A * 7/1980 Broers ............... H01J 37/04
250/311
4,694,178 A * 9/1987 Harte ................. B82Y 10/00
250/396 R
(Continued)

FOREIGN PATENT DOCUMENTS

EP 0736893 A2 10/1996
EP 1388884 A2 2/2004
(Continued)

OTHER PUBLICATIONS

Heertjes et al. Hybrid Control for Motion Systems with Improved Disturbance Rejection. 2008. [retrieved on Nov. 9, 2012]. Retrieved from the Internet: <http://libra.msra.cn/Publications/5332087/hybrid-control-for-motion-systems-with-improved-disturbance-rejection>. 7 pages.
(Continued)

*Primary Examiner* — Steven H Whitesell Gordon
(74) *Attorney, Agent, or Firm* — Suiter Swantz pc llo

(57) ABSTRACT

A linear stacked stage suitable for REBL may include a first upper fast stage configured to translate a first plurality of wafers in a first direction along a first axis, the first upper fast stage configured to secure a first plurality of wafers; a second upper fast stage configured to translate a second plurality of wafers in a second direction along the first axis,
(Continued)

the second upper fast stage configured to secure the second plurality of wafers, the second direction opposite to the first direction, wherein the translation of the first upper fast stage and the translation of the second upper fast stage are configured to substantially eliminate inertial reaction forces generated by motion of the first upper fast stage and the second upper fast stage; and a carrier stage configured to translate the first and second upper fast stages along a second axis.

63 Claims, 15 Drawing Sheets

(51) Int. Cl.
  *H01J 37/317* (2006.01)
  *B82Y 10/00* (2011.01)
  *B82Y 40/00* (2011.01)
(52) U.S. Cl.
  CPC ...... *G03F 7/70758* (2013.01); *G03F 7/70766* (2013.01); *H01J 37/20* (2013.01); *H01J 37/3174* (2013.01); *H01J 2237/20221* (2013.01); *H01J 2237/31774* (2013.01); *H01J 2237/31789* (2013.01)
(58) Field of Classification Search
  CPC ........... H01J 37/3174; H01J 2237/3175; H01J 2237/20221; H01J 2237/20278; H01J 2237/202; H01J 2237/31774
  See application file for complete search history.

(56) References Cited

U.S. PATENT DOCUMENTS

| | | | |
|---|---|---|---|
| 5,895,924 A * | 4/1999 | Yasuda | B82Y 10/00 250/398 |
| 5,969,441 A * | 10/1999 | Loopstra | B23Q 1/621 248/178.1 |
| 5,981,118 A | 11/1999 | Yasutake et al. | |
| 6,046,456 A * | 4/2000 | Bills | H01J 41/02 250/397 |
| 6,046,459 A * | 4/2000 | Yasutake | B82Y 10/00 250/491.1 |
| 6,089,525 A * | 7/2000 | Williams | G03F 7/70716 248/550 |
| 6,408,045 B1 | 6/2002 | Matsui et al. | |
| 6,469,773 B1 | 10/2002 | Iwamoto | |
| 7,566,882 B1 | 7/2009 | Hess | |
| 7,633,070 B2 | 12/2009 | Zywno et al. | |
| 2004/0026634 A1* | 2/2004 | Utsumi | B82Y 10/00 250/492.23 |
| 2005/0264777 A1* | 12/2005 | Gardner | G03F 7/70275 355/53 |
| 2008/0142733 A1* | 6/2008 | Zywno | H01J 37/20 250/491.1 |
| 2009/0086180 A1* | 4/2009 | Ottens | G03F 7/70725 355/53 |

FOREIGN PATENT DOCUMENTS

| | | |
|---|---|---|
| JP | H08279450 A | 10/1996 |
| JP | 2000505958 A | 7/1998 |
| JP | 2008501243 A | 12/2005 |
| JP | 2010147468 A | 7/2010 |
| JP | 2010 258017 A | 11/2010 |

OTHER PUBLICATIONS

Freed et al. Demonstration of Lithography Patterns Using Reflective E-Beam Direct Write. Apr. 4, 2011. [retrieved on Nov. 9, 2012]. Retrieved from the Internet: <http://proceedings.spiedigitallibrary.org/proceeding.aspx?articleid=727590>. 2 pages.

* cited by examiner

LINEAR STAGE FOR REFLECTIVE ELECTRON BEAM LITHOGRAPHY

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s))

RELATED APPLICATIONS

For purposes of the USPTO extra-statutory requirements, the present application constitutes a national stage of PCT/US2012/53927, filed Sep. 6, 2012, entitled LINEAR STAGE FOR REFLECTIVE ELECTRON BEAM LITHOGRAPHY, naming Upendra Ummethala, Layton Hale, Joshua Clyne, Samir Nayfeh, and Mark Williams as inventors, which claims priority to United States Provisional Patent Application entitled REBL LINEAR STAGE BASED SYSTEM ARCHITECTURE, naming Upendra Ummethala as inventor, filed Sep. 6, 2011, Application Ser. No. 61/531,509.

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

TECHNICAL FIELD

The present invention generally relates to reflective electron beam lithography, and more particularly to a linear stacked stage suitable for use in a reflective electron beam lithography system.

BACKGROUND

A lithographic process includes the patterned exposure of a resist allowing portions of the resist to be selectively removed, thereby exposing underlying areas for selective processing, such as etching, material deposition, ion implantation and the like. Typically, lithographic processes utilize ultraviolet light for selective exposure of the resist. In addition, charged particle beams (e.g., electron beams) have been used for high resolution lithographic resist exposure. The use of e-beam based lithography systems allows for relatively accurate control of the electron beam at relatively low power and relatively high speed. Electron beam lithographic systems may include electron-beam direct write (EBDW) lithography systems and electron beam projection lithography systems.

In EBDW lithography, the substrate (e.g., semiconductor wafer) is sequentially exposed by a focused electron beam, whereby the beam is scanned over the whole wafer and the desired structure is written on the wafer by a corresponding blanking of the beam. Alternatively, in a vector scan method, the focused electron beam is guided over the regions to be exposed. The beam spot may be shaped by a diaphragm. Scanning e-beam lithography is distinguished by high flexibility, since the circuit geometries are stored in a computer and can be optionally varied. Furthermore, very high resolutions can be attained by electron beam writing, since electron foci, with small diameters, may be attained with electron-optical imaging systems. However, it is disadvantageous in that the process is very time-consuming, due to the sequential, point-wise writing. Scanning e-beam lithography is therefore at present mainly used for the production of the masks used in projection lithography. It would therefore be advantageous to provide an EBDW lithography system with improved throughput. The present invention seeks to cure the deficiencies of the prior art.

SUMMARY

A linear stacked stage suitable for reflective electron beam lithography (REBL) is disclosed. In a first aspect, a linear stacked stage suitable for reflective electron beam lithography (REBL) may include, but is not limited to, a first upper fast stage configured to translate a first plurality of wafers in a first direction along a first axis, the first upper fast stage configured to secure a first plurality of wafers; a second upper fast stage configured to translate a second plurality of wafers in a second direction along the first axis, the second upper fast stage configured to secure the second plurality of wafers, the second direction opposite to the first direction, wherein the translation of the first upper fast stage and the translation of the second upper fast stage are configured to substantially eliminate inertial reaction forces generated by motion of the first upper fast stage and the second upper fast stage; and a carrier stage configured to translate the first upper fast stage and the second upper fast stage along a second axis substantially orthogonal to the first axis, the first upper fast stage and the second upper fast stage disposed on the surface of the carrier stage.

In another aspect, a linear stacked stage suitable for reflective electron beam lithography (REBL) may include, but is not limited to, a first upper fast stage configured to translate a first plurality of wafers in a first direction along a first axis, the first upper fast stage configured to secure a first plurality of wafers; a second upper fast stage configured to translate a second plurality of wafers in a second direction along the first axis, the second upper fast stage configured to secure the second plurality of wafers; and a carrier stage configured to translate the first upper fast stage and the second upper fast stage along a second axis substantially orthogonal to the first axis, the first upper fast stage and the second upper fast stage disposed on the surface of the carrier stage.

In another aspect, a linear stacked stage suitable for reflective electron beam lithography (REBL) may include, but is not limited to, a first plurality of upper fast stages; a second plurality of upper fast stages, each upper fast stage of the first plurality of upper fast stages corresponding to an upper fast stage in the second plurality of upper fast stages, each upper fast stage of the first plurality of upper fast stages configured to translate a wafer in a first direction along a first axis, each corresponding upper fast stage of the second plurality of upper fast stages configured to translate an additional wafer in a second direction along the first axis, the second direction opposite to the first direction, wherein the translation of each upper fast stage of the first plurality of upper fast stages and the translation of each corresponding upper fast stage of the second plurality of upper fast stages are configured to substantially eliminate inertial reaction forces generated by motion of the first plurality of upper fast stages and the second plurality of upper fast stages; and a carrier stage configured to translate the first plurality of upper fast stages and the second plurality of upper fast stages along a second axis substantially orthogonal to the first axis, the first plurality of upper fast stages and the second plurality of upper fast stages disposed on the surface of the carrier stage.

In another aspect, a linear stacked stage suitable for reflective electron beam lithography (REBL) may include, but is not limited to, a first upper fast stage configured to translate a first plurality of wafers along at least one of a first axis and a second axis, the first upper fast stage configured to secure the first plurality of wafers; a second upper fast stage configured to translate a second plurality of wafers along at least one of the first axis and the second axis, the second upper fast stage configured to secure the second plurality of wafers; and a carrier stage configured to support the first upper fast stage and the second upper fast stage.

A reflective electron beam lithography (REBL) probe system is disclosed. In a first aspect, the system may include, but is not limited to, one or more electron optical columns; a stacked scanning stage configured to translate one or more wafers under the one or more electron optical columns, the stack scanning stage comprising: a first upper fast stage configured to translate a first wafer along at least one of a first axis and a second axis; a second upper fast stage configured to translate a second wafer along at least one of a first axis and a second axis; a carrier stage, the first upper fast stage and the second upper fast stage disposed on an upper surface of the carrier stage, the carrier stage configured to translate at least one of the first upper fast stage and the second upper fast stage along at least one of the first axis and the second axis.

A reflective electron beam lithography (REBL) production system is disclosed. In a first aspect, the system may include, but is not limited to, two or more pluralities of electron optical columns; a stacked scanning stage configured to translate one or more wafers under each of the two or more pluralities of electron optical columns, the stack scanning stage comprising: a first upper fast stage configured to translate a first wafer along at least one of a first axis and a second axis; a second upper fast stage configured to translate a second wafer along at least one of a first axis and a second axis; a carrier stage, the first upper fast stage and the second upper fast stage disposed on an upper surface of the carrier stage, the carrier stage configured to translate at least one of the first upper fast stage and the second upper fast stage along at least one of the first axis and the second axis.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIGS. 1 through 8, a linear stacked stage suitable for reflective electron beam lithography (REBL) is described in accordance with the present disclosure. The present invention is directed toward a linear scanning stage including one or more discrete stage levels suitable for use in a REBL based direct write e-beam lithography machine. In one aspect, the stacked stage assembly of the present invention may include an upper fast stage assembly disposed on top of a carrier stage assembly. Further, the upper fast stage assembly may consist of a long-stroke stage assembly (including two or more individual long-stroke stages) and a short-stroke stage assembly (including two or more individual short-stroke stages) disposed on top of the long-stroke assembly. In a further aspect of the present invention, the motion of the individual translating stages of the upper stage assembly may be coordinated such that combined motion acts to cancel out inertial reaction forces generated by their movement. This feature eliminates or reduces the need for sacrificial counter masses commonly needed to reduce the impact of inertial reaction forces caused by the various translating stages of a stage system. While the majority of the present disclosure focuses on the implementation of the stacked stage assembly in the context of direct write e-beam lithography, it is recognized that the present invention may be extended to additional electron optical systems such as e-beam based wafer inspection systems.

Figure 1:
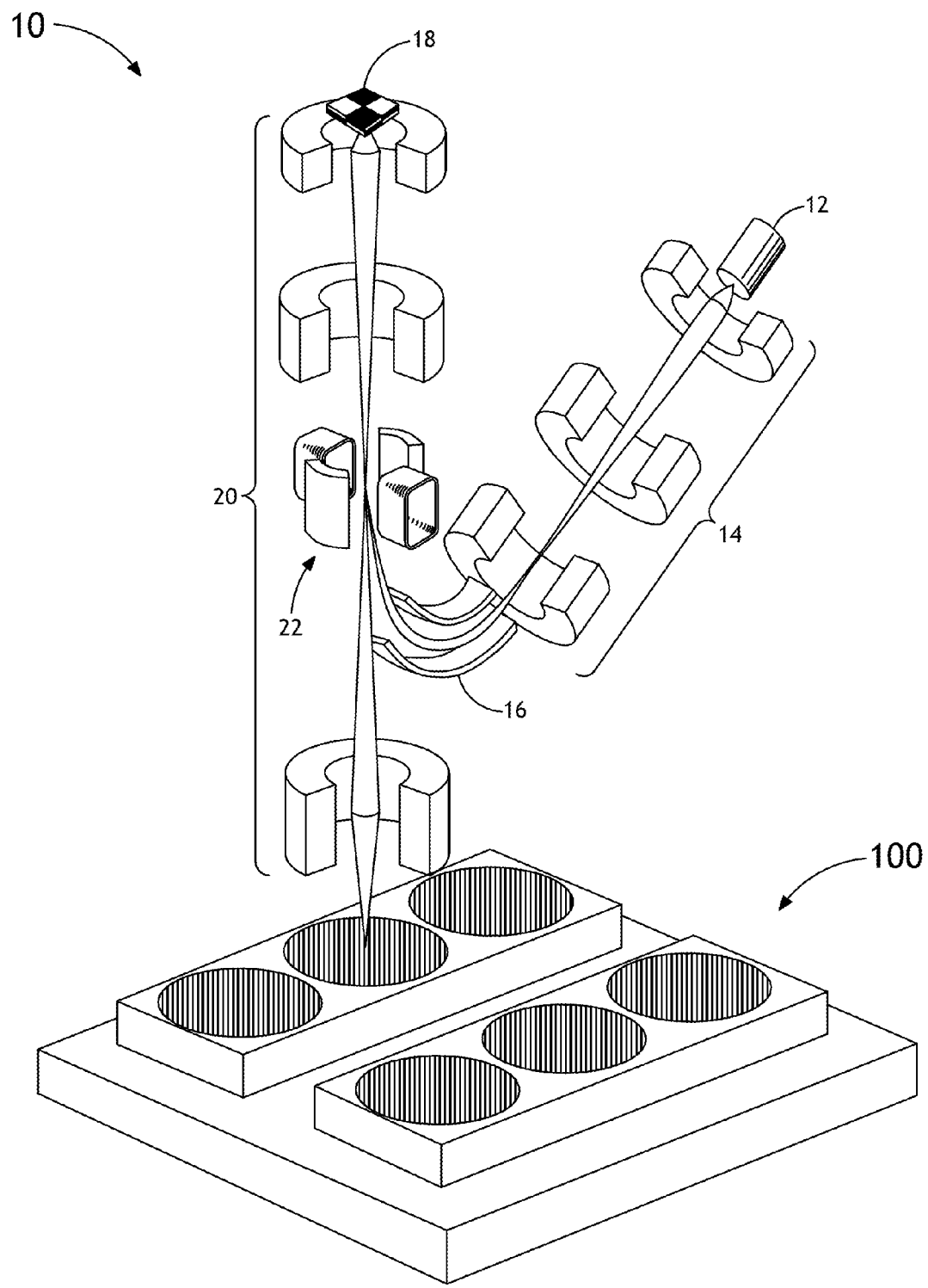
FIG. 1 is a schematic view of a reflective electron beam lithography (REBL) system, in accordance with one embodiment of the present invention.

FIG. 1 illustrates a simplified schematic view of a REBL system 10, in accordance with one embodiment of the present invention. The REBL system 10 may include an electron gun 12, a set of illumination optics 14, and an e-beam bender 16, which together act to direct an illumination beam onto a digital pattern generator (DPG) chip 18. The DPG chip 18 is used for generating patterns on the wafer, whereby the programmed pattern of the DPG chip 18 is scanned across one or more wafers disposed on a linear stacked stage 100. Projection optics 20 are utilized to direct a projection e-beam from the surface of the DPG chip 18 onto the surface of the one or more wafers. The projection optics 20 may include an ExB filter 22 (e.g. Wien Filter) consisting of crossed electrostatic and magnetic deflection fields suitable for separating the projection beam from the illumination beam. The remainder of this disclosure will focus on various aspects of the linear stacked stage 100.

Figure 2A:
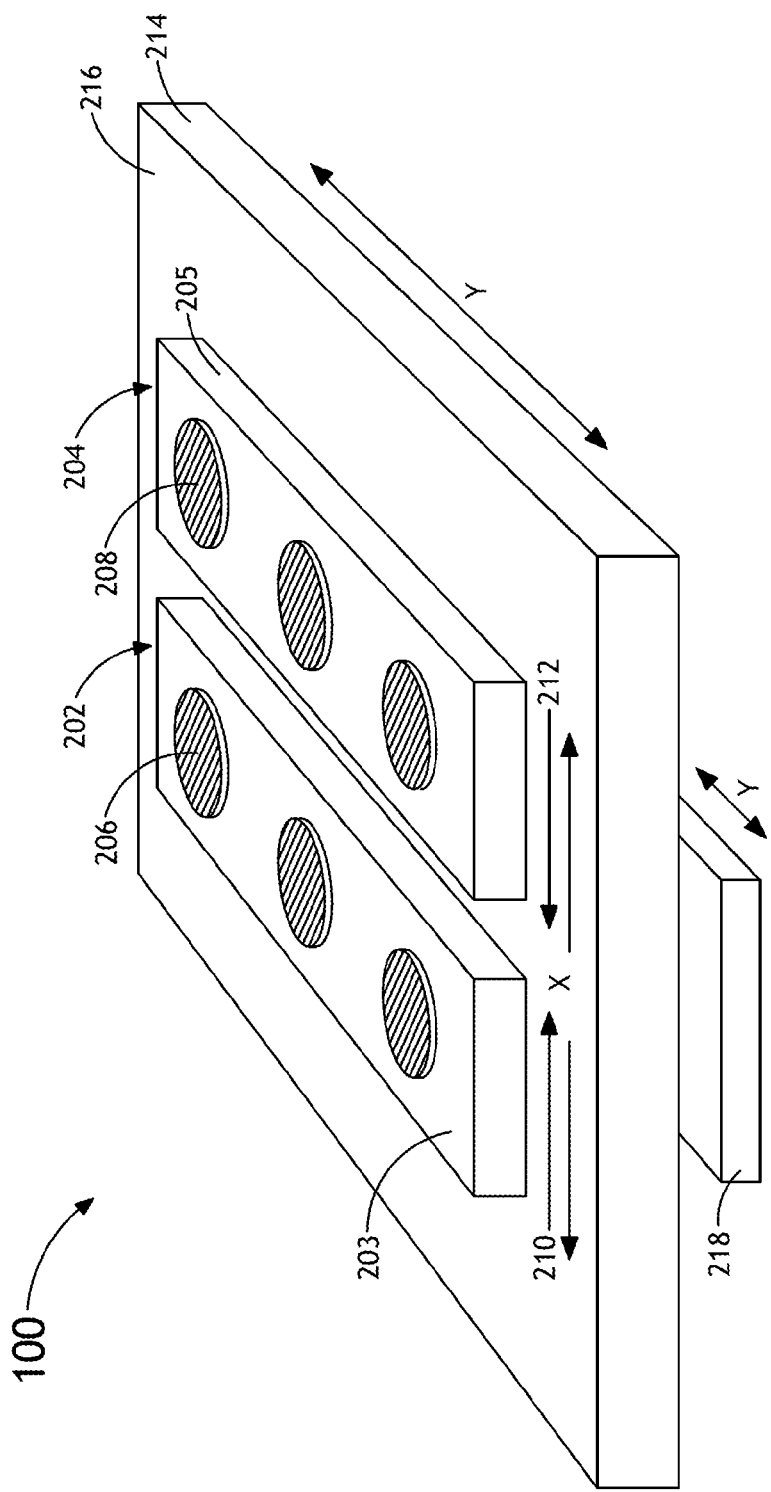
FIG. 2A is a high level schematic view of a linear stacked scanning stage, in accordance with one embodiment of the present invention.
Figure 2B:
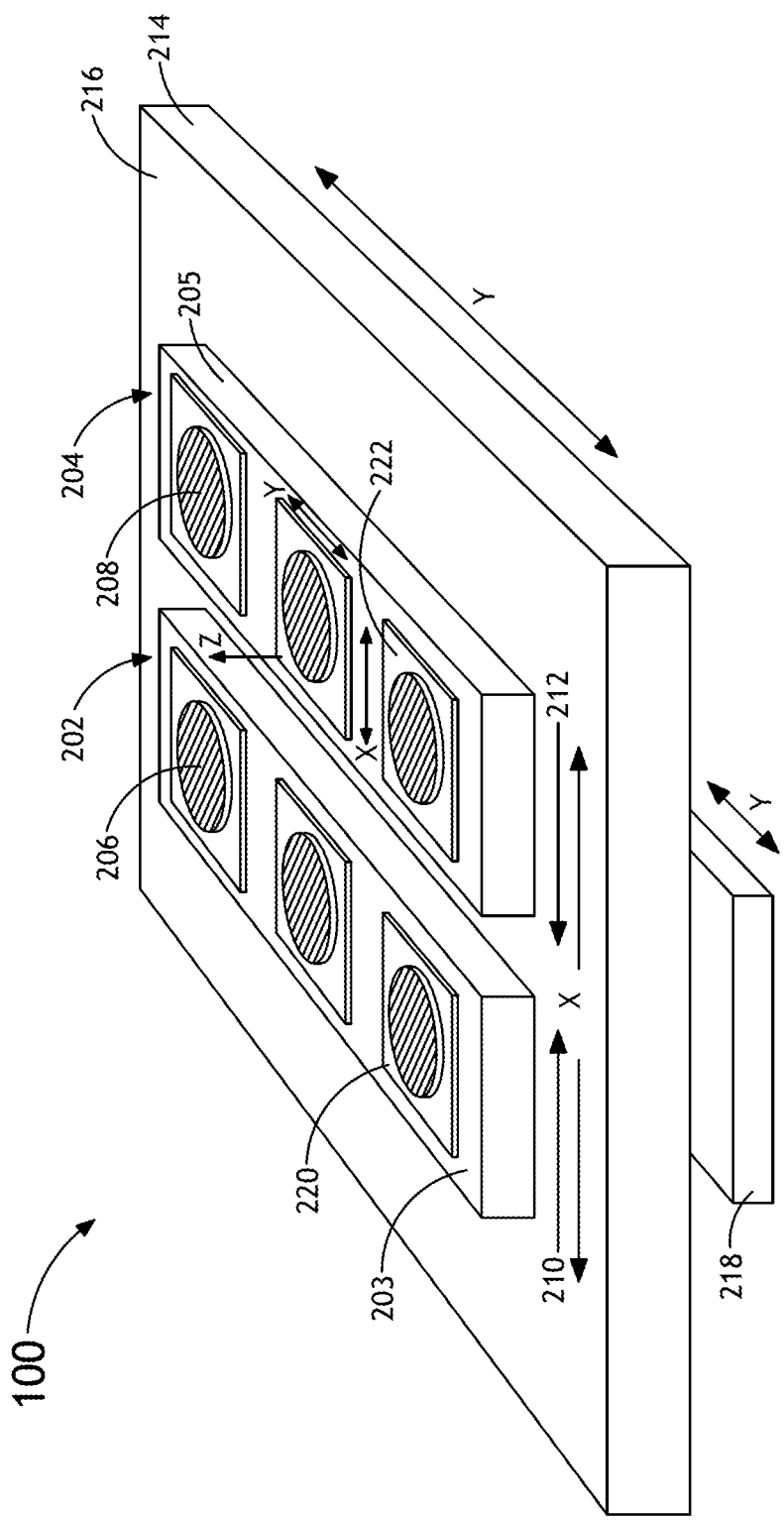
FIG. 2B is a high level schematic view of a linear stacked scanning stage, in accordance with one embodiment of the present invention.

FIGS. 2A and 2B illustrate a high level schematic view of a linear stacked wafer stage, in accordance with the present invention. The stacked wafer stage 100 includes a first upper fast stage 202 and a second upper fast stage 204 disposed on the surface 216 of a carrier stage 214. Each of the upper fast stages 202, 204 is configured to secure and translate a set of wafers 206, 208 (e.g., semiconductor wafers). In this regard, the first upper fast stage 202 is configured to secure and translate a first set of wafers 206, while the second upper stage 204 is configured to secure and translate a second set of wafers 206. In a further aspect, the upper fast stages 202 and 204 are translatable in opposite directions along the X-axis, as indicated by arrows 210 and 212. In this sense, the motion of the first upper stage 202 and the second upper stage 204 are coordinated such that the inertial reaction forces generated by the motion of the first upper fast stage 202 and the second upper fast stage 204 are substantially canceled out. In this sense, the first upper fast stage 202 and the second upper fast stage 204 may be thought of as moving "in sync" with one another in order to minimize the inertial reaction forces experienced by the rest of the supporting system.

In an additional aspect, the carrier stage 214, which carriers the first upper fast stage 202 and the second upper fast stage 204, is configured to translate the first upper fast stage 202 and the first upper fast stage 204 along the Y-axis (perpendicular to the X-axis), as indicated in FIG. 2A. Applicant notes herein that for the purposes of the present disclosure the X-axis, Y-axis, Z-axis are used to generically to indicate a first axis, a second axis, and a third axis which are arranged orthogonal to one another.

It is noted herein that the first upper fast stage 202 and the second upper fast stage 204 are suitable for moving the sets of wafers 206, 208 relative to the e-beam optics, at relatively high linear speeds along the scan direction. For example, the upper stage 202 and 204 may translate the wafers at speeds on the order of 1 m/s. In contrast, the carrier stage 214 may translate the upper stage assembly (i.e., all components disposed on carrier stage) at relatively low speeds along the slow step direction of the system 100.

In a further aspect of the present invention, each of the upper fast stages 202, 204 may include a long-stroke scanning stage. For example, the first upper fast stage 202 may include a first long-stroke scanning stage 203, while the second upper fast stage 204 may include a second long-stroke scanning stage 205. In a further embodiment, each of the long-stroke scanning stages 203, 205 may include a magnetic levitation, or "maglev," stage. For example, the long-stroke stages 203, 205 of the upper fast stages 202, 204 may each include a single axis maglev stage. For instance, each long-stroke stage 203, 205 may include a single axis maglev stage suitable for translation along the X-axis. In a further embodiment, the long-stroke stages 203, 205 may include a set of variable reluctance actuators. In another embodiment, each of long-stroke stages 203, 205 of the upper fast stages 202, 204 may include an air bearing stage. For instance, each long-stroke stage 203, 205 may include a single axis air bearing stage suitable for translation along the X-axis. In a further aspect, the long-stroke stages 203, 205 of the stacked stage 100 are suitable for moving the sets of wafers 206, 208 relative to the e-beam optics, at relatively high speeds (e.g., 1 m/s) along the scan direction (e.g., X-direction) of the system 100.

In a further aspect of the present invention, as shown in FIG. 2B, each of the fast upper stages 202, 204 may include a set of short-stroke stages 220, 222. For example, the first fast upper stage 202 may include a first plurality of short-stoke stages 220 disposed on the surface of the long-stroke scanning stage 203 of the first upper stage 202. In addition, the second fast upper stage 204 may include a second plurality of short-stroke stages 222 disposed on the surface of the long-stroke scanning stage 205 of the second upper stage 204. Each short-stroke stage of the first plurality of short-stroke stages 220 may be configured to hold and secure a wafer of the first plurality of wafers 206, while each of the second plurality of short-stroke stages 222 may be configured to secure a wafer of the second plurality of wafers 208.

In one embodiment, the short-stroke stages 220, 222 may include maglev stages configured for actuation along at least one of the X-axis, a Y-axis, and a Z-axis, thereby providing six degrees of translational freedom to each wafer disposed on the given short-stroke stage. In a further embodiment, the short-stroke stages 220, 222 may include maglev stages controlled utilizing Lorentz type motors. In a general sense, the short-stroke stages 220, 222 are configured to provide small position changes to the wafers 206, 208 relative to the E-beam lithography optics (e.g., optics 20 in FIG. 1) allowing for lithography at the 32 nm node at beyond.

In another aspect, the carrier stage 214 may include any slow step stage known in the art. In one embodiment, the carrier stage 214 may include a maglev stage. For example, the carrier stage 214 may include a single axis maglev stage suitable for translation along the Y-axis. In another embodiment, the carrier stage 214 may include an air bearing stage. For instance, the carrier stage 214 may include a single axis air bearing stage suitable for translation along the Y-axis. In yet another embodiment, the carrier stage 214 may include a single axis roller bearing stage. For example, the carrier stage 214 may include a cross-roller stage suitable for translation along the Y-axis. It is further noted that the carrier stage 214 generally translates the first upper stage 202 and the second upper stage 204 at very slow speeds (e.g., slower than 1 m/s) relative to the e-beam lithography optics.

In an additional aspect, the stacked stage 100 may further include a counter mass 218 suitable for countering at least a portion of the inertial forces generated by the motion of the carrier stage or the first upper stage 202 and the second upper stage 204. In one embodiment, the counter mass is configured for translation along the Y-axis. In this regard, the counter mass is configured to move along the Y-axis in a manner (i.e., distance and speed) to substantially counter inertial reaction forces along the Y-direction generated by the motion of the carrier stage 214 and the stages carried on the carrier stage 214.

In another embodiment, the wafers 206, 208 may be secured to the upper fast stages 202 and 204 in any manner known in the art. For instance, the wafers 206, 208 may be mechanically secured to the wafer stages 202, 204 using a set of mechanical chucks (one for each wafer). In another instance, the wafers 206, 208 may be secured to the wafer stages 202, 204 using a set of air chucks (one for each wafer). In yet another instance, the wafers 206, 208 may be secured to the wafer stages 202, 204 using electrostatic chucks (one for each wafer), as will be discussed in greater detail further herein.

Figure 3A:
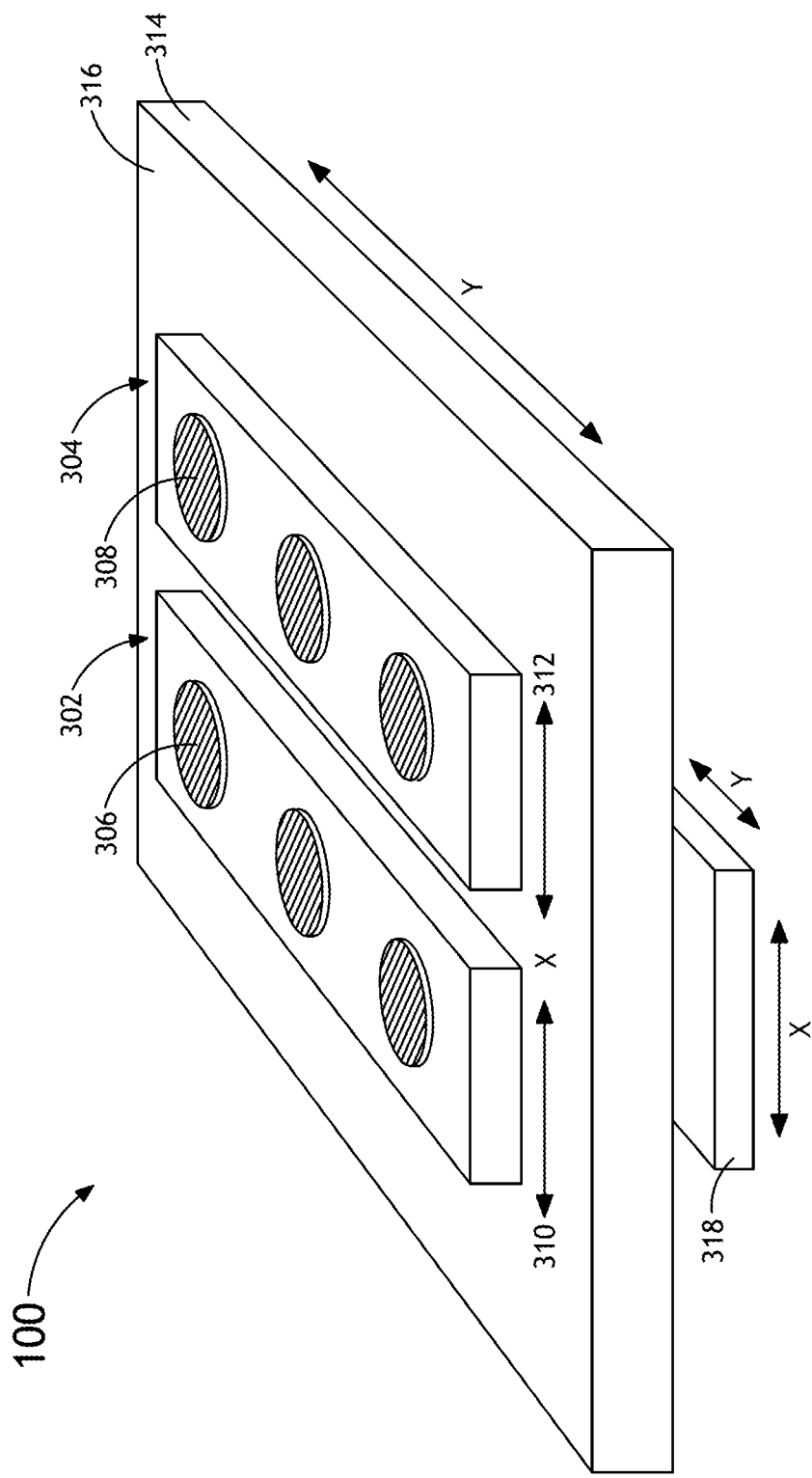
FIG. 3A is a high level schematic view of a linear stacked scanning stage, in accordance with one embodiment of the present invention.
Figure 3B:
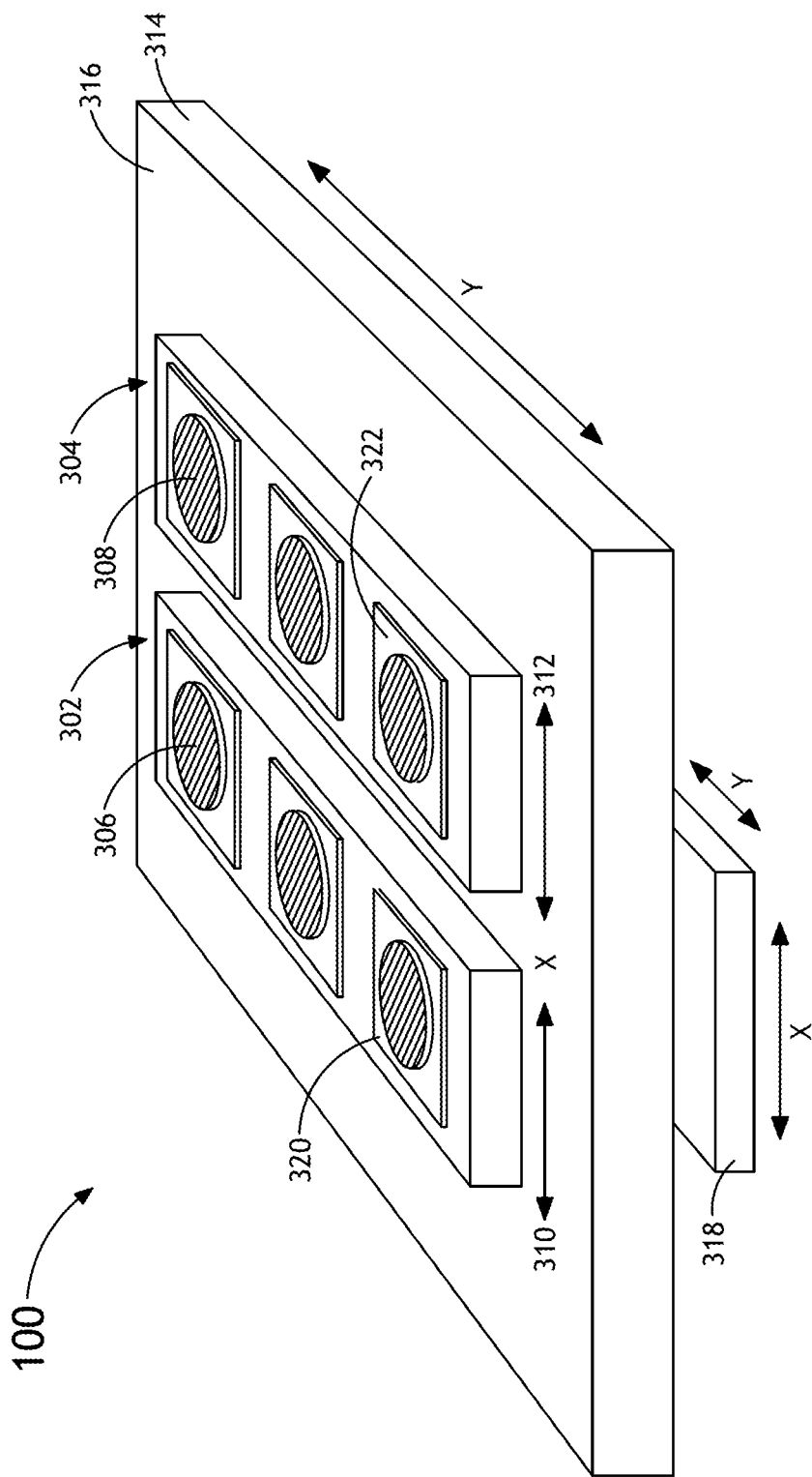
FIG. 3B is a high level schematic view of a linear stacked scanning stage, in accordance with one embodiment of the present invention.

FIGS. 3A and 3B illustrate a high level schematic view of a linear stacked wafer stage 100, in accordance with an alternative embodiment of the present invention. It is noted herein that the previous description of the stacked wafer stage 100 of FIGS. 2A and 2B should be interpreted to apply all of the various embodiments and implementation of the present disclosure unless otherwise noted. As such, components and embodiments of FIGS. 2A and 2B should be interpreted to extend to FIGS. 3A and 3B.

As previously described, the stacked wafer stage 100 includes a first upper fast stage 302 and a second upper fast stage 304 disposed on the surface 316 of a carrier stage 314. Each of the upper fast stages 302, 304 is configured to secure and translate a set of wafers 306, 308. In this regard, the first upper fast stage 302 is configured to secure and translate a first set of wafers 306, while the second upper stage 304 is configured to secure and translate a second set of wafers 308.

In contrast to the embodiment of FIGS. 2A and 2B, the upper fast stages 302 and 304 are translatable in either opposite directions or the same direction along the X-axis, as indicated by arrows 310 and 312. As such, the upper stages 302 and 304 may move in a manner which does not act to cancel out their inertial reaction forces. In an additional aspect, the carrier stage 314 is configured to translate the first upper fast stage 302 and the first upper fast stage 304 along the Y-axis, as indicated in FIG. 3A.

In a further aspect, in order to compensate for the inertial reaction forces that may be generated due to the motion of the upper fast stages 302, 304 along the X-axis and the motion of the carrier stage 314 along the Y-axis, the stage 100 may include a counter mass 318 suitable for translation along both the X-axis and the Y-axis. In this regard, the counter mass 318 is configured to move along the X-axis and/or Y-axis in a manner (i.e., distance, direction, and speed) to substantially counter inertial reaction forces along the X- and Y-direction generated by the Y-motion of the carrier stage 314 and the X-motion of the upper fast stages 302, 304.

As previously described herein, each of the upper fast stages 302, 304 may include a tong-stroke scanning stage. For example, the first upper fast stage 302 may include a first long-stroke scanning stage, while the second upper fast stage 304 may include a second long-stroke scanning stage. In a further embodiment, as previously described, each of the long-stroke scanning stages may include a maglev stage (e.g., variable reluctance actuators), or an air bearing stage translatable along the X-axis.

As shown in FIG. 3B, each of the fast upper stages 302, 304 may include a set of short-stroke stages 320, 322. For example, the first fast upper stage 302 may include a first plurality of short-stoke stages 320 disposed on the surface of the long-stroke scanning stage of the first upper stage 302. In addition, the second fast upper stage 304 may include a second plurality of short-stroke stages 322 disposed on the surface of the long-stroke scanning stage of the second upper stage 304. Each short-stroke stage of the first plurality of short-stroke stages 320 may be configured to hold and secure a wafer of the first plurality of wafers 306, while each of the second plurality of short-stroke stages 322 may be configured to secure a wafer of the second plurality of wafers 308. As previously noted herein, the short-stroke stages 320, 322 may include maglev stages configured for actuation along at least one of the X-axis, a Y-axis, and a Z-axis. In a further embodiment, the short-stroke stages 320, 322 may include maglev stages controlled utilizing Lorentz type motors.

In another aspect, as previously described herein, the carrier stage 314 may include a maglev stage, an air bearing stage, or a roller bearing stage suitable for translation along the Y-axis.

In another embodiment, the wafers 306, 308 may be secured to the upper fast stages 302 and 304 in any manner known in the art. For instance, the wafers 306, 308 may be mechanically secured to the wafer stages 302, 304 using a set of mechanical chucks (one for each wafer). In another instance, the wafers 306, 308 may be secured to the wafer stages 302, 304 using a set of air chucks (one for each wafer). In yet another instance, the wafers 306, 308 may be secured to the wafer stages 302, 304 using electrostatic chucks (one for each wafer), as will be discussed in greater detail further herein.

Figure 4A:
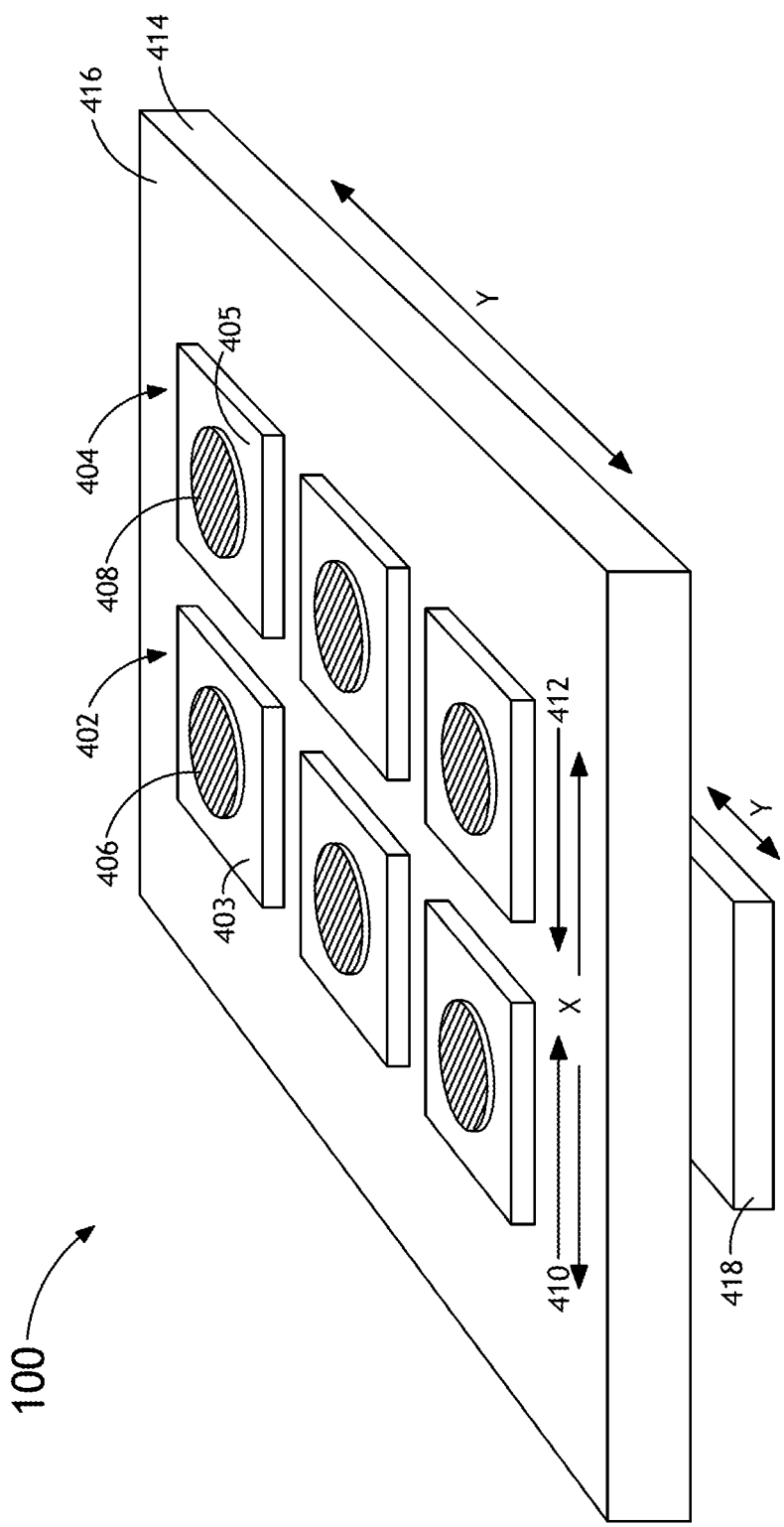
FIG. 4A is a high level schematic view of a linear stacked scanning stage, in accordance with one embodiment of the present invention.
Figure 4B:
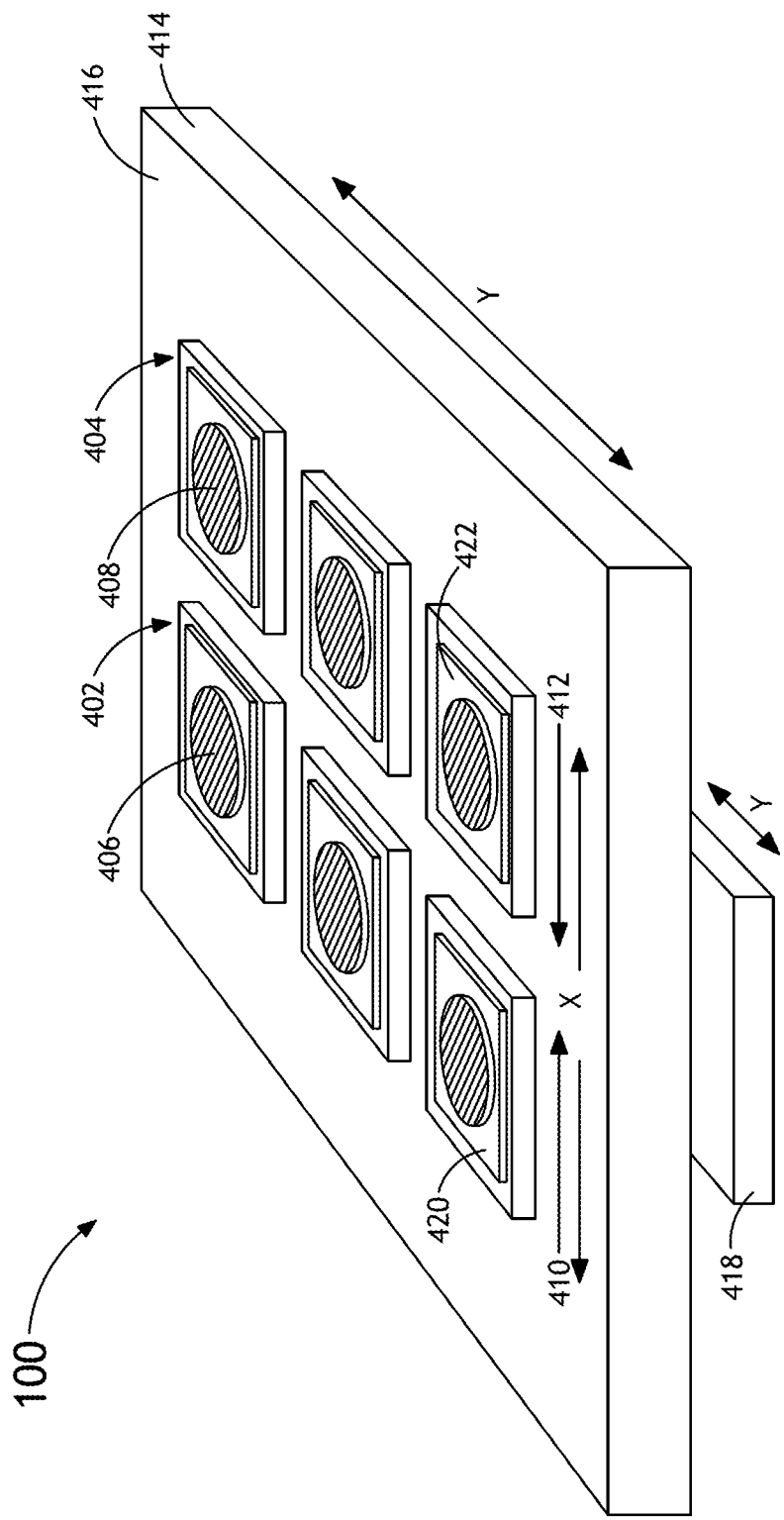
FIG. 4B is a high level schematic view of a linear stacked scanning stage, in accordance with one embodiment of the present invention.

FIGS. 4A and 4B illustrate a high level schematic view of a linear stacked wafer stage 100, in accordance with an alternative embodiment of the present invention. It is noted herein that the previous description of the stacked wafer stage 100 of FIGS. 2A and 2B and the stacked wafer stage 100 of FIGS. 3A and 3B should be interpreted to apply to all of the various embodiments and implementation of the present disclosure unless otherwise noted. As such, components and embodiments of FIGS. 2A, 2B, 3A, and 3B should be interpreted to extend to FIGS. 4A and 4B.

As shown in FIGS. 4A and 4B, the stacked wafer stage 100 includes a first plurality of upper fast stages 402 and second plurality of upper fast stages 404. In this regard, each upper fast stage of the first plurality of upper fast stages 402 corresponds to an upper fast stage in the second plurality of upper fast stages 404. Each of the upper fast stages of the first plurality of upper fast stages 402 is configured to secure and translate a wafer 406, while each of the upper fast stages of the second plurality of upper fast stages 404 is configured to secure and translate a wafer 408.

The upper fast stages of the first plurality of upper fast stages 402 and the second plurality of upper fast stages 404 are translatable in opposite directions along the X-axis, as indicated by arrows 410 and 412. In this sense, the motion of the first upper stage of the first plurality of upper fast stages 402 and the second upper stages of the second plurality of upper fast stages 404 are coordinated such that the inertial reaction forces generated by the motion of the first upper fast stages 402 and the second upper fast stages 404 are substantially canceled out.

In a further aspect, in order to compensate for the inertial reaction forces that may be generated due to the motion of a carrier stage 414 along the Y-axis, the stage 100 may include a counter mass 418 suitable for translation along the Y-axis. In this regard, the counter mass 418 is configured to move along the Y-axis in a manner (i.e., distance and speed) to substantially counter inertial reaction forces along the Y-direction generated by the Y-motion of the carrier stage 414.

In another embodiment, each of the upper fast stages 402, 404 may include a long-stroke scanning stage. For example, each of the first plurality of upper fast stages 402 may include a first long-stroke scanning stage 403, while the second plurality of upper fast stages 404 may include a second long-stroke scanning stage 405. In a further embodiment, as previously described, each of the long-stroke scanning stages 403, 405 may include a maglev stage (e.g., variable reluctance actuators), or an air bearing stage translatable along the X-axis.

As shown in FIG. 4B, each of the fast upper stages 402, 404 may include a short-stroke stage 420, 422. As previously noted herein, the short-stroke stages 420, 422 may include maglev stages configured for actuation along at least one of the X-axis, a Y-axis, and a Z-axis. In a further embodiment, the short-stroke stages 420, 422 may include maglev stages controlled utilizing Lorentz type motors.

In another aspect, as previously described herein, the carrier stage 414 may include a maglev stage, an air bearing stage, or a roller bearing stage suitable for translation along the Y-axis.

Figure 5A:
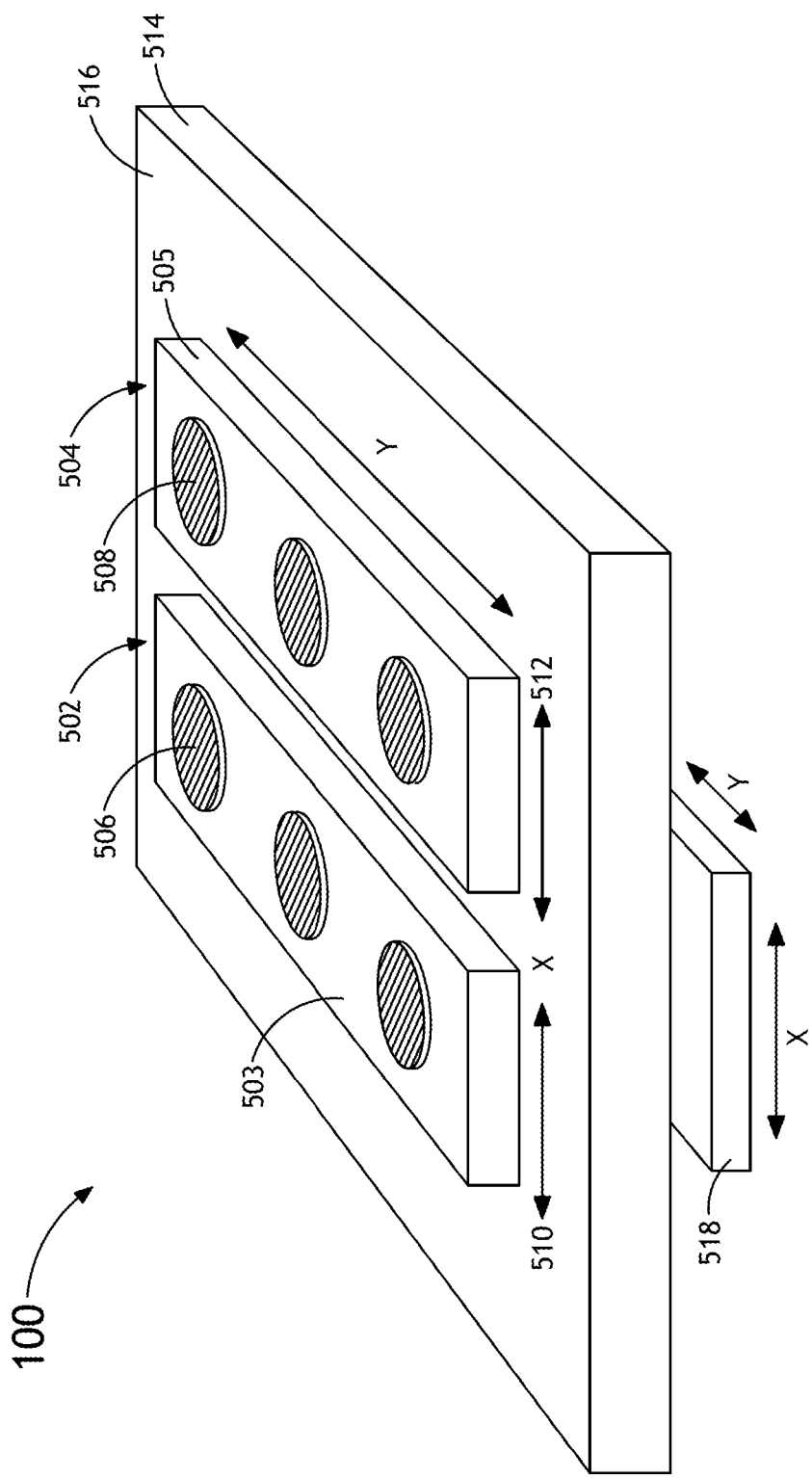
FIG. 5A is a high level schematic view of a linear stacked scanning stage, in accordance with one embodiment of the present invention.
Figure 5B:
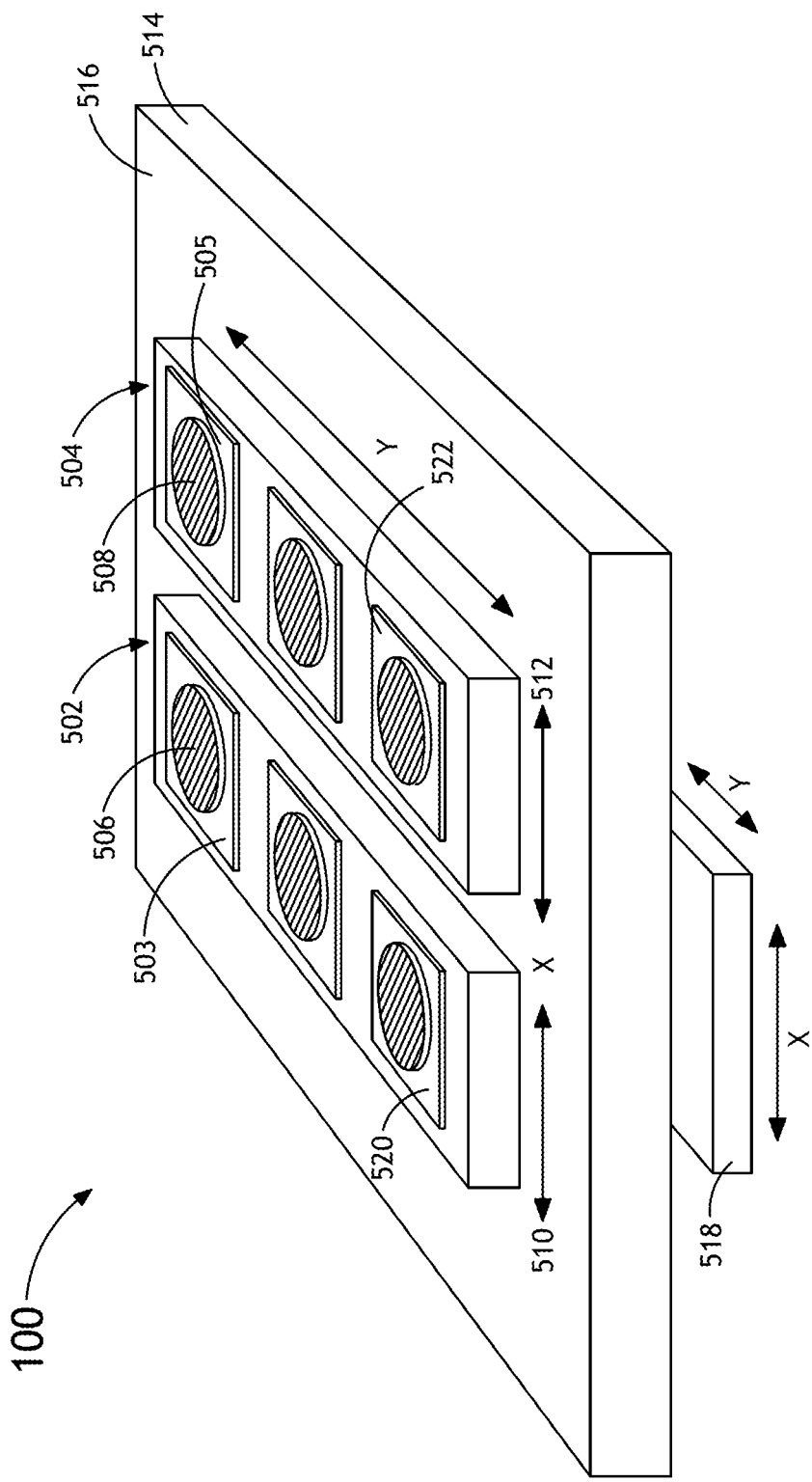
FIG. 5B is a high level schematic view of a linear stacked scanning stage, in accordance with one embodiment of the present invention.

FIGS. 5A and 5B illustrate a high level schematic view of a linear stacked wafer stage 100, in accordance with an alternative embodiment of the present invention. It is noted herein that the previous description of the stacked wafer stage 100 of FIGS. 2A-4B should be interpreted to apply to all of the various embodiments and implementations of the present disclosure unless otherwise noted. As such, components and embodiments of FIGS. 2A-4B should be interpreted to extend to FIGS. 5A and 5B.

As shown in FIGS. 5A and 5B, the stacked wafer stage 100 includes a first upper fast stage 502 and a second upper fast stage 504 disposed on a surface 516 of a carrier stage 514. Each of the upper fast stages 502, 504 is configured to secure and translate a set of wafers 506, 508. In this regard, the first upper fast stage 502 is configured to secure and translate a first set of wafers 506, while the second upper stage 504 is configured to secure and translate a second set of wafers 508.

The upper fast stages 502 and 504 are translatable in either opposite directions or the same direction along the X-axis, as indicated by arrows 510 and 512. As such, the upper stages 502 and 504 may move in a manner which does not act to cancel out their inertial reaction forces. Further, the upper fast stages 502 and 504 are further translatable in a direction along the Y-axis. In an additional aspect, the carrier stage 514 is fixed and configured to hold the first upper fast stage 502 and the second upper fast stage 504.

In a further aspect, in order to compensate for the inertial reaction forces that may be generated due to the motion of the upper fast stages 502, 504 along the X-axis and the Y-axis, the stage 100 may include a counter mass 518 suitable for translation along both the X-axis and the Y-axis.

In this regard, the counter mass 518 is configured to move along the X-axis and/or Y-axis in a manner (i.e., distance, direction, and speed) to substantially counter inertial reaction forces along the X- and Y-direction generated by the X- and Y-motion of the upper fast stages 502, 504.

As previously described herein, each of the upper fast stages 502, 504 may include a long-stroke scanning stage. For example, the first upper fast stage 502 may include a first long-stroke scanning stage 503, while the second upper fast stages 504 may include a second long-stroke scanning stage 505. In a further embodiment, as previously described, each of the long-stroke scanning stages 503, 505 may include a maglev stage (e.g., variable reluctance actuators), or an air bearing stage translatable along the X- and/or Y-axis.

As shown in FIG. 5B, the fast upper stages 502, 504 may include a short-stroke stage 520, 522. As previously noted herein, the short-stroke stages 520, 522 may include maglev stages configured for actuation along at least one of the X-axis, a Y-axis, and a Z-axis. In a further embodiment, the short-stroke stages 520, 522 may include maglev stages controlled utilizing Lorentz type motors.

Figure 6A:
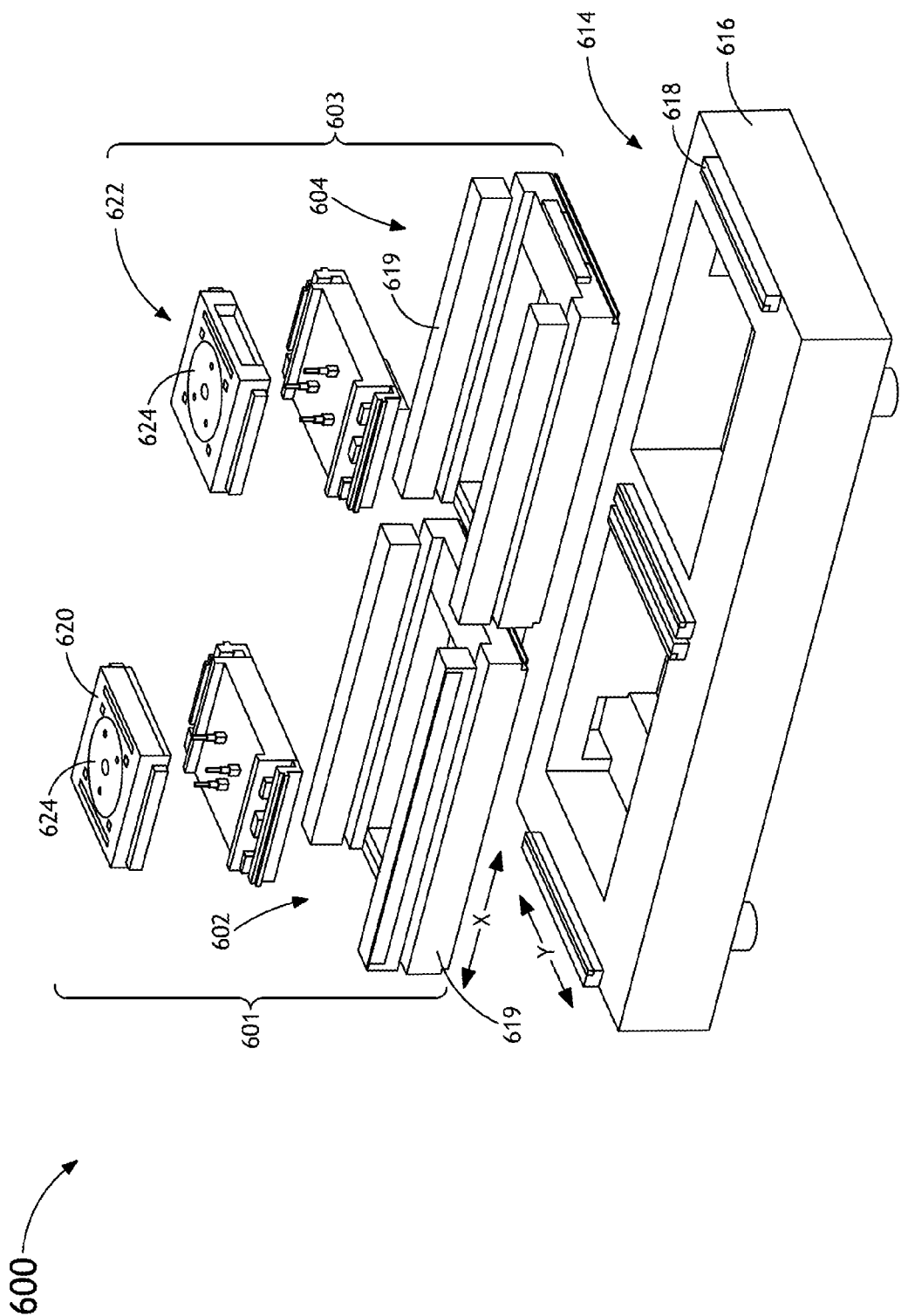
FIG. 6A is a schematic view of linear stacked scanning stage, in accordance with a preferred embodiment of the present invention.
Figure 6B:
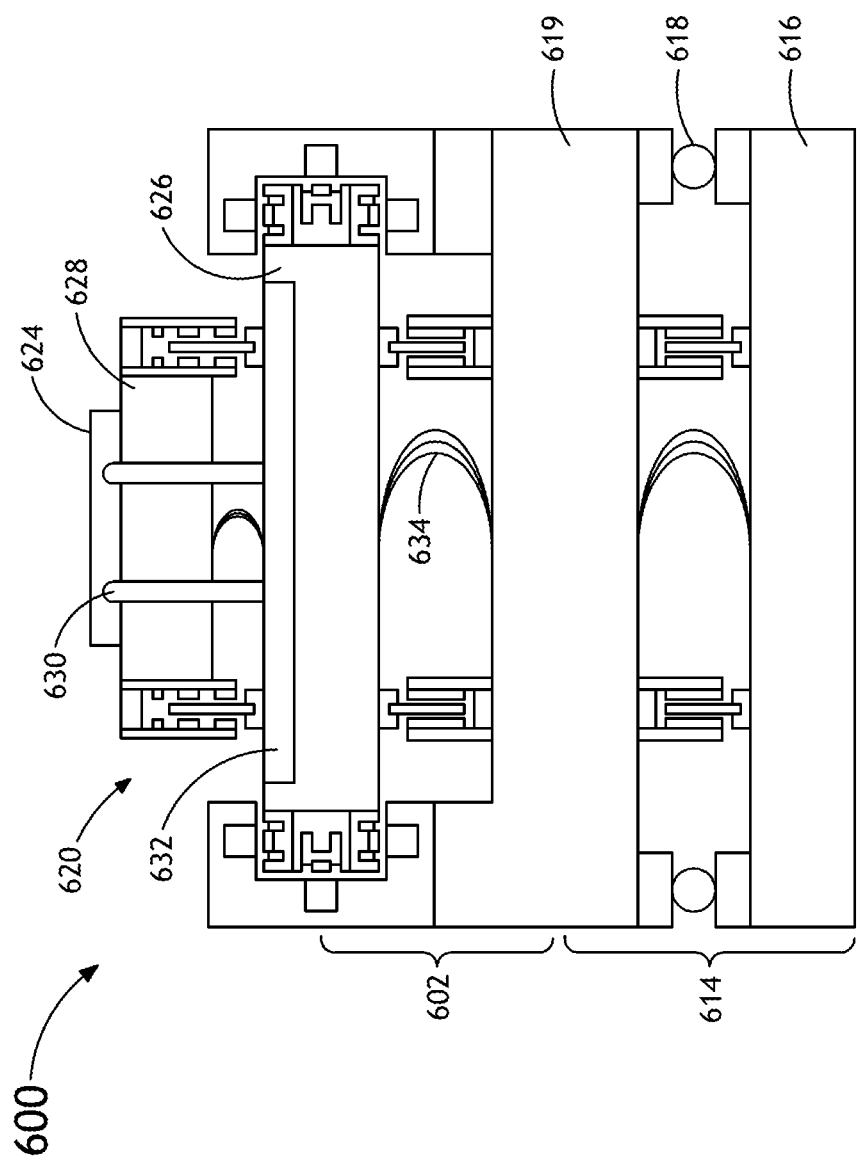
FIG. 6B is a cut away schematic view of linear stacked scanning stage, in accordance with a preferred embodiment of the present invention.
Figure 6C:
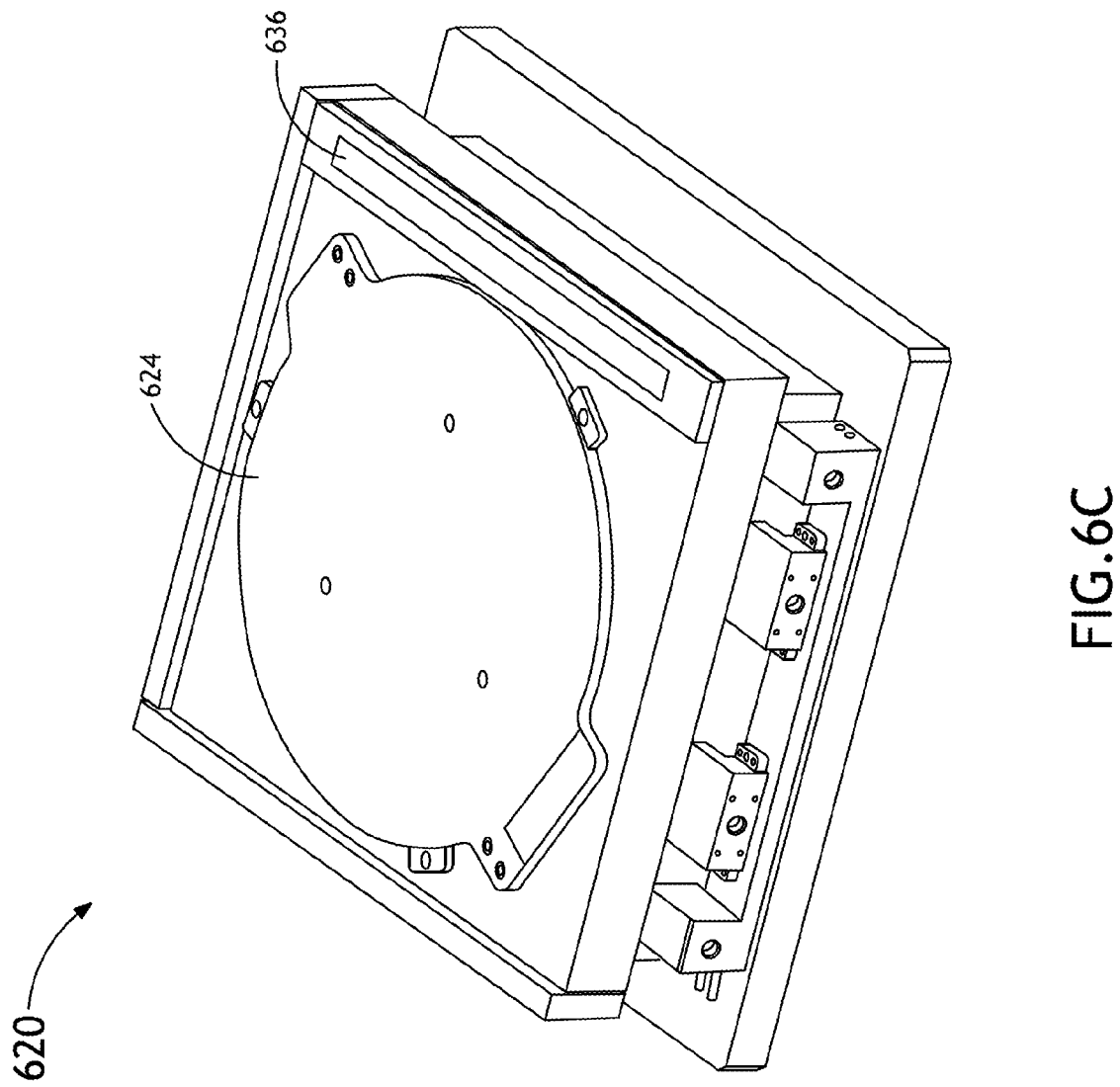
FIG. 6C is a schematic view of a short-stroke scanning stage of a linear stacked scanning stage, in accordance with a preferred embodiment of the present invention.

FIGS. 6A-6C illustrate schematic views of a stacked scanning stage 600 in accordance with a preferred embodiment of the present invention. It is noted herein that the embodiments and components discussed previously herein should be interpreted to extend to the system 600 unless otherwise noted. Moreover, the embodiments and components discussed further herein should be interpreted to extend to the various embodiments and components described previously herein.

The preferred stacked stage architecture 600 may include a base assembly 616, a carrier stage 614 configured for translation in the Y-direction, a first upper stage 601 and a second upper stage 603. In one aspect, the first upper stage 601 may include a first long-stroke stage 602 and a short-stroke stage 620, while the second upper stage 603 may include a second long-stroke stage 604 and a short-stroke stage 622. Motion of the first upper stage 601 and the second upper stage 603 may coordinated such that the inertial reaction forces from each is canceled. Further, the first upper stage 601 and the second upper stage 603 are both operably connected to a conventional roller bearing carrier stage 614 configured to translate the entire assembly along the Y-axis, as discussed previously throughout the present invention. In turn, the carrier stage 614 may be operably coupled to the surface of the base assembly 616.

In one embodiment, the first upper stage 601 and the second upper stage 603 may be housed in a common vacuum system (e.g., housed in the same vacuum vessel). In addition, the first upper stage 601 and the second upper stage 603 may share various platform components.

In a further embodiment, each of the long-stroke scanning stages 602 604 may include a magnetic levitation, or "maglev," stage. For example, the long-stroke stages 602, 604 of the upper fast stages 601, 603 may each include a single axis maglev stage. For instance, each long-stroke stage 602, 604 may include a single axis maglev stage suitable for translation along the X-axis. In a further embodiment, the long-stroke stages 602, 604 may include a set of variable reluctance actuators. In this regard, linear scanning in the system 600 may be achieved using a pair of three-phase linear actuators. In another embodiment, each of long-stroke stages 602, 604 of the upper fast stages 601, 603 may include an air bearing stage. For instance, each long-stroke stage 602, 604 may include a single axis air bearing stage suitable for translation along the X-axis.

In another embodiment, the short-stroke stages 620, 622 may include maglev stages configured for actuation along at least one of the X-axis, a Y-axis, and a Z-axis, thereby providing six degrees of translational freedom to each wafer disposed on the given short-stroke stage. In a further embodiment, the short-stroke stages 620, 622 may include maglev stages controlled utilizing Lorentz type motors. In a further aspect, each short-stroke stage 620, 622 may be actuated with Lorentz motors that are actively cooled.

In another embodiment, the carrier stage 614 may include a set of roller bearings 618 configured to translate a carriage 619 of the given long-stroke stage (602 or 604) relative to the base assembly 616 along the Y-direction.

As shown in FIG. 6B, a short-stroke stage 620 of a given upper fast stage (e.g., stage 601 or stage 603) may be coupled to an underlying long-stroke stage 602 via an interface plate 632 and a carrier 626 of the long-stroke stage 602. In addition, the stacked stage 600 may include a service loop 634 that provides the various cabling for the various components (e.g., motors, sensors, coolant supply, gas supply, and the like) throughout the various levels (e.g., carrier stage 614, long-stroke stage 602, and short-stroke stage 620) of the stage 600.

In another embodiment, each short-stroke stage 620, 622 may be fabricated from a material having high thermal stability characteristics. For example, the short-stroke stages 620, 622 may be formed from a material having minimal thermal expansion properties. Various glass-ceramic materials have sufficiently small thermal expansion coefficients for implementation in the present invention. For example, the material ZERODUR is a glass-ceramic material displaying highly stable thermal expansion characteristics. In a further embodiment, the material of the short-stroke stages 620, 622 may include pass through holes suitable for circulating a selected coolant, thereby increasing the thermal control (and thermal expansion/contraction) of the short-stroke stages 620, 622.

In another embodiment, the long-stroke stages 602, 604 and short-stroke stages 620, 622 of the system 600 may include magnetic shielding and may be positioned such that their influence on the e-beam of the implementing lithography system is maintained within an acceptable tolerance level. For example, the long-stroke stages 602, 604 and the short-stroke stages 620, 622 may include magnetic shielding suitable for shielding spatially fixed magnetic disturbances (e.g., at a threshold level of approximately 100 milli-Gauss at the position of the e-beam. By way of another example, the long-stroke stages 602, 604 and the short-stroke stages 620, 622 may include magnetic shielding suitable for shielding stochastic magnetic disturbances (e.g., at a threshold level of 1 milli-Gauss at the e-beam).

In another embodiment, as shown in FIG. 6C, an electrostatic chuck 624 may be operably connected to each short-stroke stage 620, 622 of each upper stage 601, 603. For example, the electrostatic chuck 624 may include a double-sided electrostatic chuck. In this regard, a double-sided electrostatic chuck may be used to attach the chuck to a given short-stroke stage. The electrostatic chuck may also be used to attach a given wafer to the surface of the chuck, thereby securing the wafer to the given short-stroke stage of the given upper stage of the stacked scanning stage 600. In a further embodiment, the electrostatic chuck 624 may include cooling and gas injection sub-systems suitable for providing thermal management and adequate thermal contact to the wafer. In further embodiment, each short-stroke stage 620, 622 may include a set of lift pins suitable for loading and unloading a wafer on the electrostatic chuck.

In another embodiment, each short-stroke stage 620, 622 may include an alignment sensor 636. The alignment sensor 636 is configured to provide registration of an e-beam of a lithography tool to the given wafer stage. In this sense, the alignment sensor 636 may allow for e-beam alignment with the wafer disposed on a given short-stroke stage as frequently as every scan.

Figure 6D:
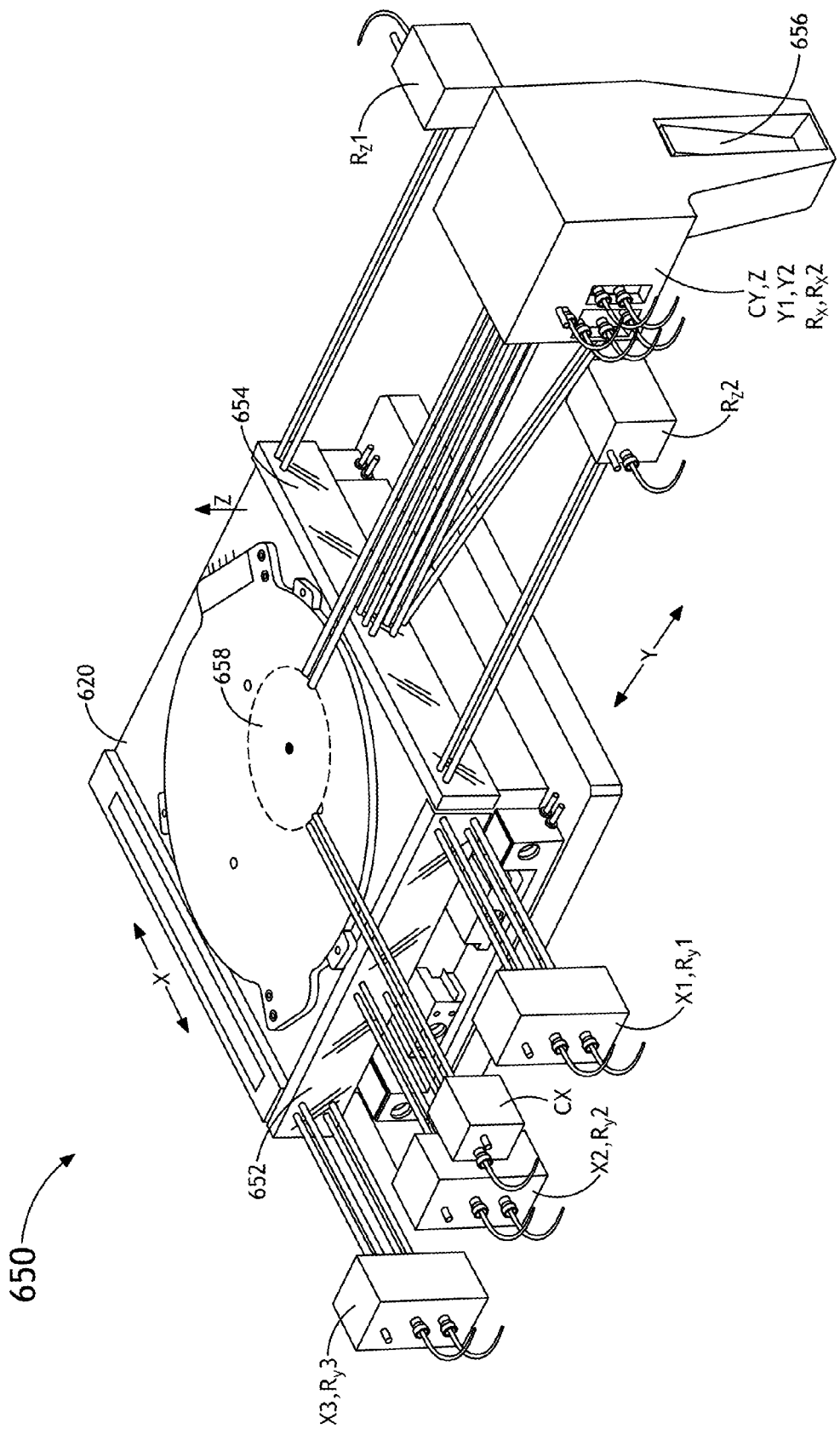
FIG. 6D is a schematic view of an interferometer based stage metrology system used to measure the position of a short-stroke scanning stage of the linear stacked scanning stage, in accordance with a preferred embodiment of the present invention.

In a further aspect, as shown in FIG. 6D, one or more short-stroke stages 620, 622 of the stacked stage architecture 600 may include an interferometer based stage metrology system 650. The stage metrology system 650 is configured to interferometrically measure the positions of the short-stroke stages (e.g., 620 or 622) of the stacked stage 600 in all six degrees of freedom (i.e., x, y, and z positions). In one aspect, each short-stroke stage 620, 622 may include a mirror block 628, having a first mirror 652 suitable for measuring the X-position of the given short-stroke stage 620, 622. In another aspect, each short-stroke stage 620, 622 may include a second mirror 654 suitable for measuring the Y- and Z-positions of the given short-stroke stage 620, 622. The stage metrology system 650 includes various optical reference elements mounted on a temperature controlled and vibration isolated metrology frame (not shown). In one aspect, a portion of the optical reference elements may be used to measure the X-position of the stages 620, 622 utilizing the X-mirror 652. In addition, the stage metrology system 650 may include optical reference elements used to measure the Y-position of the stages 620, 622 utilizing the Y/Z mirror 654. The Z-position of the stages 620, 622 may be measured utilizing a tilted mirror 656. The use of redundant interferometer axes allow for the recovery of the shape error in the interferometer mirrors, X-mirror 652 and Y/Z mirror 654. In another aspect, the position of an e-beam column, depicted by the dotted circle 658 may be determined utilized interferometer elements CX and CY, allowing the metrology system 650 to track the position of the e-beam column 658.

In a further embodiment, in order to accommodate the stroke of the stage 620, multiple interferometer measurements are "stitched," or combined, in order to provide a single measurement.

Figure 7:
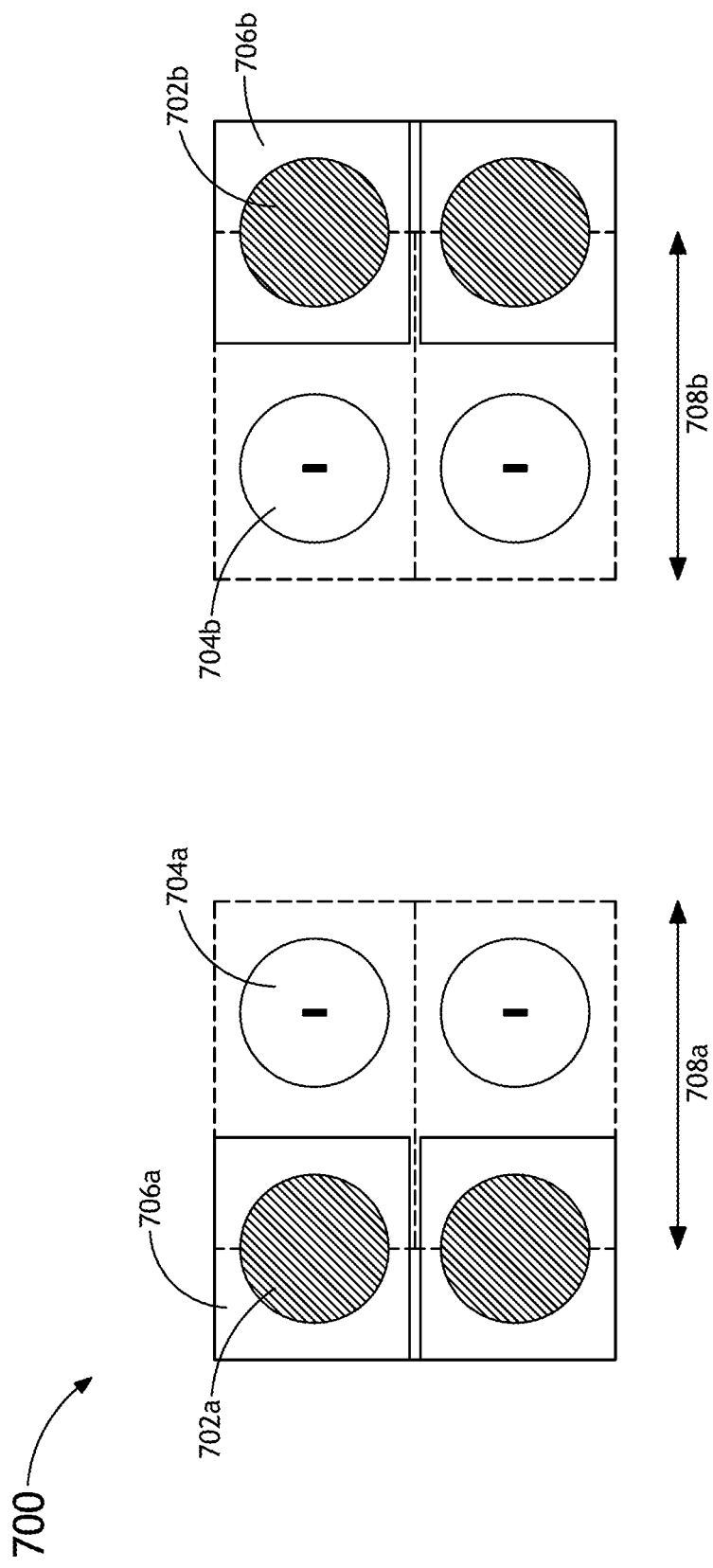
FIG. 7 is a top view of the wafer-electron optical column configuration for a REBL probe tool.

FIG. 7 illustrates a top view of the electron beam column configuration with respect to one or more wafers 702a, 702b actuated utilizing a stacked scanning stage 706a or 706b, in accordance with one embodiment of the present invention. It is noted herein that the configuration 700 depicted in FIG. 7 is a configuration suitable for implementation in a REBL probe tool setting. In one aspect, the electron beam columns 704a, 704b are arranged in a one-to-one correspondence with the underlying wafers 702a, 702b. In this regard, the stacked scanning stages 706a, 706b are configured to move each wafer 702a, 702b under an electron optical column 704a, 704b of the system 700.

In a further embodiment, each stacked scanning stage 702a, 702b may include a first upper fast stage configured to translate a first wafer along at least one of a first axis and a second axis. For example, the first upper fast stage 706a may translate a first wafer 702a along at least one of a first axis (e.g., X-axis) or a second axis (e.g., Y-axis). For instance, the stage 706a may translate the first wafer 702a along the scanning direction 708a. In another embodiment, a second upper fast stage 706b is configured to translate a second wafer 702b along a scanning direction 708b. Further, the stacked scanning stage may include a carrier stage (not shown). In a further aspect, the first upper fast stage and the second upper fast stage may be disposed on an upper surface of the carrier stage, whereby the carrier stage is configured to translate at least one of the first upper fast stage and the second upper fast stage along at least one of the first axis and the second axis.

Figure 8:
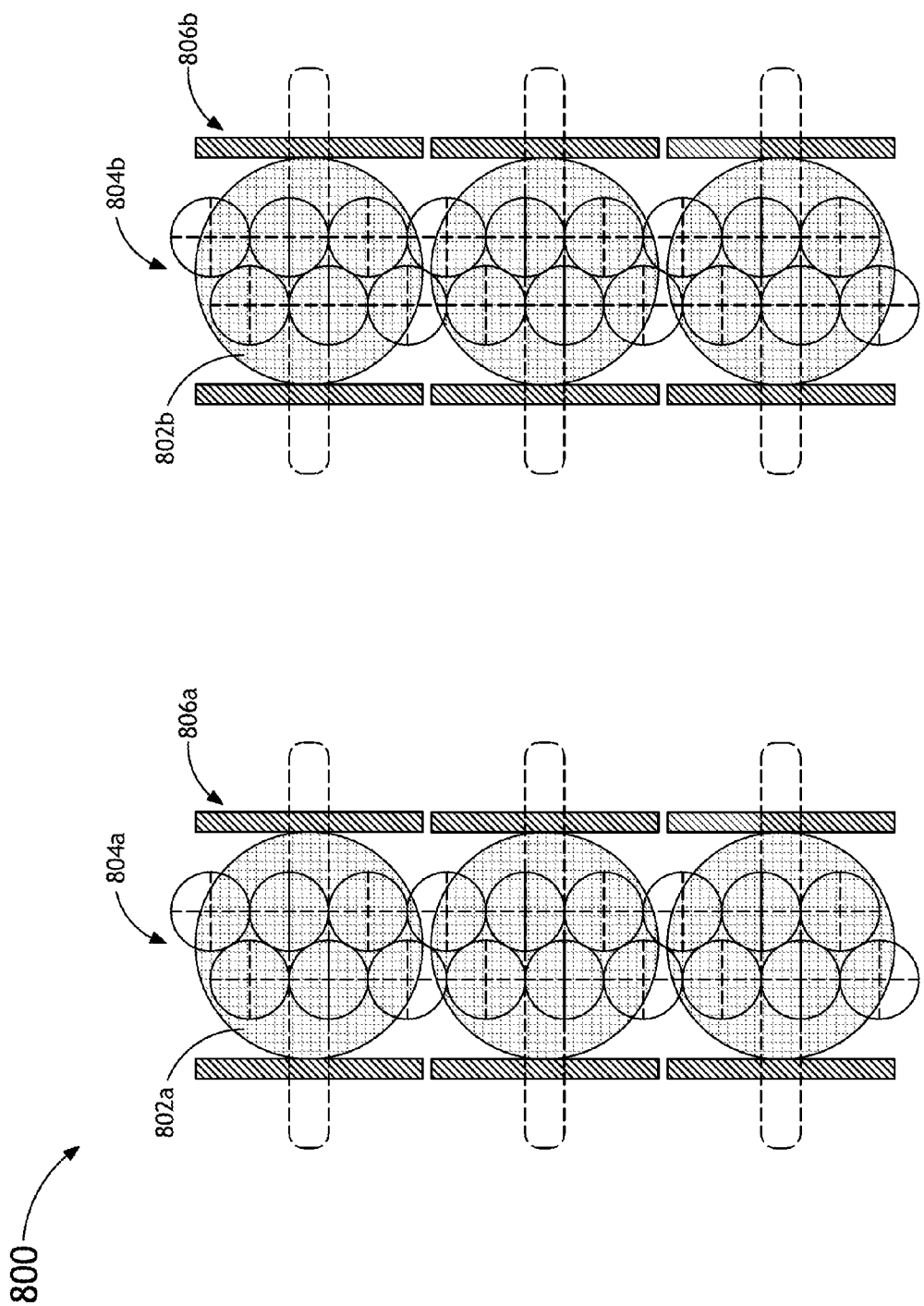
FIG. 8 is a top view of the wafer-electron optical column configuration for a REBL production tool.

FIG. 8 illustrates a top view of a multiple electron beam column configuration of a REBL production tool with respect to one or more wafers 802a, 802b actuated utilizing a stacked scanning stage 806a or 806b, in accordance with one embodiment of the present invention. It is noted herein that the configuration 800 depicted in FIG. 8 is a configuration suitable for implementation in a REBL production tool setting, such as a high volume manufacturing (HVM) tool. In one aspect, the electron beam columns 804a, 804b are arranged such that each wafer is scanned simultaneously with multiple electron beam columns. For example, as shown in FIG. 8, each wafer may correspond with six tightly arranged electron beam columns. In this regard, the stacked scanning stages 806a, 806b are configured to move each wafer 802a, 802b under a set of electron optical columns 804a, 804b of the system 800.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A linear stacked stage, comprising:
    a first upper fast stage configured to translate a first plurality of wafers in a first direction along a first axis at a first selected speed, the first upper fast stage configured to secure the first plurality of wafers;
    a second upper fast stage configured to translate a second plurality of wafers in a second direction along the first axis at a second selected speed, the second upper fast stage configured to secure the second plurality of wafers, the second direction opposite to the first direction, wherein the translation of the first upper fast stage and the translation of the second upper fast stage are configured to substantially eliminate inertial reaction forces generated by motion of the first upper fast stage and the second upper fast stage; and
    a carrier stage configured to translate the first upper fast stage and the second upper fast stage along a second axis substantially orthogonal to the first axis at a third selected speed, the first upper fast stage and the second upper fast stage disposed on the surface of the carrier stage, wherein the first upper fast stage, the second upper fast stage and the carrier stage are configured to scan one or more wafers of at least one of the first plurality of wafers or the second plurality of wafers under a plurality of electron columns,
    wherein the third selected speed of the carrier stage is slower than the first selected speed of the first upper fast stage and the second selected speed of the second upper fast stage.

2. The stacked stage of claim 1, further comprising:
    a counter mass configured for translation along the second axis, wherein the counter mass is further configured to substantially counter inertial reaction forces generated by motion of the carrier stage.

3. The stacked stage of claim 1, wherein at least one of the first upper fast stage and the second upper fast stage includes a long-stroke scanning stage.

4. The stacked stage of claim 3, wherein the long-stroke scanning stage comprises:
    a magnetic levitation stage.

5. The stacked stage of claim 4, wherein the magnetic levitation stage comprises:
    a set of variable reluctance actuators.

6. The stacked stage of claim 3, wherein the long-stroke scanning stage comprises:
    an air bearing stage.

7. The stacked stage of claim 1, wherein at least one of the first upper fast stage and the second upper fast stage further includes a plurality of short-stroke scanning stages.

8. The stacked stage of claim 7, wherein each of the short-stroke scanning stages comprise:
    a magnetic levitation stage.

9. The stacked stage of claim 8, wherein the magnetic levitation stage comprises:
    a magnetic levitation stage controlled utilizing one or more Lorentz motors.

10. The stacked stage of claim 7, wherein each of the short-stroke scanning stages is configured to translate a wafer along at least one a first axis, a second axis and a third axis, wherein the first axis, the second axis, and the third axis are mutually perpendicular.

11. The stacked stage of claim 7, wherein each short-stroke scanning stage is equipped with an electrostatic chuck.

12. The stacked stage of claim 7, wherein each short-stroke scanning stage is equipped with an interferometer based stage metrology system.

13. The stacked stage of claim 1, wherein the carrier stage comprises:
    at least one of a magnetic levitation stage, an air bearing stage, and a roller bearing stage.

14. The stacked stage of claim 1, wherein the first upper fast stage and the second upper fast stage include magnetic shielding for shielding spatially fixed magnetic disturbances.

15. A linear stacked stage, comprising:
    a first upper fast stage configured to translate a first plurality of wafers in a first direction along a first axis at a first selected speed, the first upper fast stage configured to secure the first plurality of wafers;
    a second upper fast stage configured to translate a second plurality of wafers in a second direction along the first axis at a second selected speed, the second upper fast stage configured to secure the second plurality of wafers; and
    a carrier stage configured to translate the first upper fast stage and the second upper fast stage along a second axis substantially orthogonal to the first axis at a third selected speed, the first upper fast stage and the second upper fast stage disposed on the surface of the carrier stage, wherein the first upper fast stage, the second upper fast stage and the carrier stage are configured to scan one or more wafers of at least one of the first plurality of wafers or the second plurality of wafers under a plurality of electron columns,
wherein the third selected speed of the carrier stage is slower than the first selected speed of the first upper fast stage and the second selected speed of the second upper fast stage.

16. The stacked stage of claim 15, further comprising:
a counter mass configured for translation along at least one of the first axis and the second axis, wherein the translation of the counter mass is further configured to substantially counter inertial reaction forces generated by motion of the first upper fast stage, the second upper fast stage, and the carrier stage.

17. The stacked stage of claim 15, wherein at least one of the first upper fast stage and the second upper fast stage includes a long-stroke scanning stage.

18. The stacked stage of claim 17, wherein the long-stroke scanning stage comprises:
a magnetic levitation stage.

19. The stacked stage of claim 18, wherein the magnetic levitation stage comprises:
a set of variable reluctance actuators.

20. The stacked stage of claim 17, wherein the long-stroke scanning stage comprises:
an air bearing stage.

21. The stacked stage of claim 15, wherein at least one of the first upper fast stage and the second upper fast stage further includes a plurality of short-stroke scanning stages.

22. The stacked stage of claim 21, wherein each of the short-stroke scanning stages comprise:
a magnetic levitation stage.

23. The stacked stage of claim 22, wherein the magnetic levitation stage comprises:
a magnetic levitation stage controlled utilizing one or more Lorentz motors.

24. The stacked stage of claim 21, wherein each of the short-stroke scanning stages is configured to translate a wafer along at least one a first axis, a second axis and a third axis, wherein the first axis, the second axis, and the third axis are mutually perpendicular.

25. The stacked stage of claim 21, wherein each short-stroke scanning stage is equipped with an electrostatic chuck.

26. The stacked stage of claim 21, wherein each short-stroke scanning stage is equipped with an interferometer based stage metrology system.

27. The stacked stage of claim 15, wherein the carrier stage comprises:
at least one of a magnetic levitation stage, an air bearing stage, and a roller bearing stage.

28. The stacked stage of claim 15, wherein the first direction and the second direction are the same.

29. The stacked stage of claim 15, wherein the first direction and the second direction are different.

30. The stacked stage of claim 15, wherein the first upper fast stage and the second upper fast stage include magnetic shielding for shielding spatially fixed magnetic disturbances.

31. A linear stacked stage, comprising:
a first plurality of upper fast stages;
a second plurality of upper fast stages, each upper fast stage of the first plurality of upper fast stages corresponding to an upper fast stage in the second plurality of upper fast stages, each upper fast stage of the first plurality configured to translate a wafer in a first direction along a first axis at a first selected speed, each corresponding upper fast stage of the second plurality configured to translate an additional wafer in a second direction along the first axis at a second selected speed, the second direction opposite to the first direction, wherein the translation of each upper fast stage of the first plurality and the translation of each corresponding upper fast stage of the second plurality are configured to substantially eliminate inertial reaction forces generated by motion of the first plurality of upper fast stages and the second plurality of upper fast stages; and
a carrier stage configured to translate the first plurality of upper fast stages and the second plurality of upper fast stages along a second axis substantially orthogonal to the first axis at a third selected speed, the first plurality of upper fast stages and the second plurality of upper fast stages disposed on the surface of the carrier stage, wherein the first plurality of upper fast stages, the second plurality of upper fast stages and the carrier stage are configured to scan at least one wafer under a plurality of electron columns,
wherein the third selected speed of the carrier stage is slower than the first selected speed of the first upper fast stage and the second selected speed of the second upper fast stage.

32. The stacked stage of claim 31, further comprising:
a counter mass configured for translation along the second axis, wherein the counter mass is further configured to substantially counter inertial reaction forces generated by motion of the carrier stage.

33. The stacked stage of claim 31, wherein at least one of the first plurality of upper fast stages and the second plurality of upper fast stages comprise:
a plurality of long-stroke scanning stages.

34. The stacked stage of claim 33, wherein the plurality of long-stroke scanning stages comprises:
a plurality of magnetic levitation stages.

35. The stacked stage of claim 34, wherein each of the plurality of magnetic levitation stages comprise:
a set of variable reluctance actuators.

36. The stacked stage of claim 33, wherein the plurality of long-stroke scanning stages comprises:
an air bearing stage.

37. The stacked stage of claim 31, wherein each of at least one of the first plurality of upper fast stages and the second plurality of upper fast stages further includes a short-stroke scanning stage.

38. The stacked stage of claim 37, wherein the short-stroke scanning stage comprises:
a magnetic levitation stage.

39. The stacked stage of claim 38, wherein the magnetic levitation stage comprises:
a magnetic levitation stage controlled utilizing one or more Lorentz motors.

40. The stacked stage of claim 37, wherein the short-stroke scanning stage is configured to translate a wafer along at least one a first axis, a second axis and a third axis, wherein the first axis, the second axis, and the third axis are mutually perpendicular.

41. The stacked stage of claim 37, further comprising:
an electrostatic chuck configured to receive a wafer, the electrostatic chuck operably connected to the short-stroke scanning stage.

42. The stacked stage of claim 37, further comprising:
an interferometer based stage metrology system configured to measure the position of the short-stroke scanning stage along at least one of a first axis, a second axis, and a third axis.

43. The stacked stage of claim 31, wherein the carrier stage comprises:
at least one of a magnetic levitation stage, an air bearing stage, and a roller bearing stage.

44. The stacked stage of claim 31, wherein the plurality of first upper fast stages and the plurality of second upper fast stages include magnetic shielding for shielding spatially fixed magnetic disturbances.

45. A linear stacked stage, comprising:
a first upper fast stage configured to translate a first plurality of wafers along at least one of a first axis and a second axis at a first selected speed, the first upper fast stage configured to secure the first plurality of wafers;
a second upper fast stage configured to translate a second plurality of wafers along at least one of the first axis and the second axis at a second selected speed, the second upper fast stage configured to secure the second plurality of wafers; and
a fixed carrier stage configured to support the first upper fast stage and the second upper fast stage, wherein the first upper fast stage, the second upper fast stage and the carrier stage are configured to scan one or more wafers of at least one of the first plurality of wafers or the second plurality of wafers under a plurality of electron columns.

46. The stacked stage of claim 45, further comprising:
a counter mass configured for translation along at least one of the first axis and the second axis, wherein the translation of the counter mass is further configured to substantially counter inertial reaction forces generated by motion of the first upper fast stage and the second upper fast stage.

47. The stacked stage of claim 45, wherein at least one of the first upper fast stage and the second upper fast stage includes a long-stroke scanning stage.

48. The stacked stage of claim 47, wherein the long-stroke scanning stage comprises:
a magnetic levitation stage.

49. The stacked stage of claim 48, wherein the magnetic levitation stage comprises:
a set of variable reluctance actuators.

50. The stacked stage of claim 47, wherein the long-stroke scanning stage comprises:
an air bearing stage.

51. The stacked stage of claim 45, wherein at least one of the first upper fast stage and the second upper fast stage further includes a plurality of short-stroke scanning stages.

52. The stacked stage of claim 51, wherein each of the short-stroke scanning stages comprise:
a magnetic levitation stage.

53. The stacked stage of claim 52, wherein the magnetic levitation stage comprises:
a magnetic levitation stage controlled utilizing one or more Lorentz motors.

54. The stacked stage of claim 51, wherein each of the short-stroke scanning stage is configured to translate a wafer along at least one a first axis, a second axis and a third axis, wherein the first axis, the second axis, and the third axis are mutually perpendicular.

55. The stacked stage of claim 51, wherein each short-stroke scanning stage is equipped with an electrostatic chuck.

56. The stacked stage of claim 51, wherein each short-stroke scanning stage is equipped with an interferometer based stage metrology system.

57. The stacked stage of claim 45, wherein the position of the carrier stage is fixed.

58. The stacked stage of claim 45, wherein the first upper fast stage and the second upper fast stage include magnetic shielding for shielding spatially fixed magnetic disturbances.

59. A lithography probe system, comprising:
at least one plurality of electron optical columns;
a stacked scanning stage comprising:
a first upper fast stage configured to translate a first wafer along at least one of a first axis and a second axis at a first selected speed;
a second upper fast stage configured to translate a second wafer along at least one of a first axis and a second axis at a second selected speed;
a carrier stage, the first upper fast stage and the second upper fast stage disposed on an upper surface of the carrier stage, the carrier stage configured to translate at least one of the first upper fast stage and the second upper fast stage along at least one of the first axis and the second axis at a third selected speed, the stacked scanning stage configured to scan at least one of the first wafer or the second wafer under the at least one plurality of electron optical columns,
wherein the third selected speed of the carrier stage is slower than the first selected speed of the first upper fast stage and the second selected speed of the second upper fast stage.

60. The system of claim 59, wherein the first upper fast stage and the second upper fast stage include magnetic shielding for shielding spatially fixed magnetic disturbances.

61. A lithography production system, comprising:
two or more pluralities of electron optical columns;
a stacked scanning stage configured to translate one or more wafers under at least one of the two or more pluralities of electron optical columns, the stack scanning stage comprising:
a first upper fast stage configured to translate a first wafer along at least one of a first axis and a second axis at a first selected speed;
a second upper fast stage configured to translate a second wafer along at least one of a first axis and a second axis at a second selected speed; and
a carrier stage, the first upper fast stage and the second upper fast stage disposed on an upper surface of the carrier stage, the carrier stage configured to translate at least one of the first upper fast stage and the second upper fast stage along at least one of the first axis and the second axis at a third selected speed,
wherein the third selected speed of the carrier stage is slower than the first selected speed of the first upper fast stage and the second selected speed of the second upper fast stage.

62. The system of claim 61, wherein each of the pluralities of electron optical columns include six electron optical columns.

63. The system of claim 61, wherein the first upper fast stage and the second upper fast stage include magnetic shielding for shielding spatially fixed magnetic disturbances.

* * * * *